(12) United States Patent
Yu et al.

(10) Patent No.: US 10,229,886 B2
(45) Date of Patent: Mar. 12, 2019

(54) DISCRETE COMPONENT BACKWARD TRACEABILITY AND SEMICONDUCTOR DEVICE FORWARD TRACEABILITY

(71) Applicant: SanDisk Semiconductor (Shanghai) Co. Ltd., Shanghai (CN)

(72) Inventors: Cheeman Yu, Fremont, CA (US); Didier Chavet, Santa Rosa, CA (US)

(73) Assignee: SanDisk Semiconductor (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/053,575

(22) Filed: Feb. 25, 2016

(65) Prior Publication Data

US 2016/0181205 A1 Jun. 23, 2016

Related U.S. Application Data

(63) Continuation-in-part of application No. 13/634,068, filed as application No. PCT/CN2010/075568 on Oct. 4, 2010, now abandoned.

(51) Int. Cl.
*H01L 23/544* (2006.01)
*H01L 21/67* (2006.01)
*H01L 21/66* (2006.01)

(52) U.S. Cl.
CPC ...... *H01L 23/544* (2013.01); *H01L 21/67294* (2013.01); *H01L 22/12* (2013.01);
(Continued)

(58) Field of Classification Search
CPC . H01L 23/544; H01L 22/12; H01L 21/67294; H01L 21/00; H01L 21/02;
(Continued)

(56) References Cited

U.S. PATENT DOCUMENTS 5,271,642 A 12/1993 Jahier et al.
5,642,307 A 6/1997 Jemigan
(Continued)

FOREIGN PATENT DOCUMENTS

CN 101751592 6/2010
DE 4340223 A1 6/1994
(Continued)

OTHER PUBLICATIONS

Jerry Secrest, Die Traceability, 2002, Solid State Technology, http://electroiq.com/blog/2002/01/die-traceability/, 7 pp.*
(Continued)

*Primary Examiner* — Toan M Le
(74) *Attorney, Agent, or Firm* — Vierra Magen Marcus LLP

(57) ABSTRACT

A system is disclosed for providing backward and forward traceability by a methodology which identifies discrete components (die, substrate and/or passives) that are included in a semiconductor device. The present technology further includes a system for generating a unique identifier and marking a semiconductor device with the unique identifier enabling the semiconductor device, and the discrete components within that device, to be tracked and traced through each process and test in the production of the semiconductor device.

13 Claims, 15 Drawing Sheets

(52) U.S. Cl.
CPC ............... *H01L 2223/54406* (2013.01); *H01L 2223/54413* (2013.01); *H01L 2223/54433* (2013.01); *H01L 2924/0002* (2013.01)

(58) Field of Classification Search
CPC ........... H01L 21/70; H01L 2223/54406; H01L 2223/54413; H01L 2223/54433; H01L 2924/0002; H01L 2924/00
See application file for complete search history.

(56) References Cited

U.S. PATENT DOCUMENTS

| | | | |
|---|---|---|---|
| 6,063,685 A | 5/2000 | Steffan et al. | |
| 6,415,977 B1 | 7/2002 | Rumsey | |
| 6,830,941 B1 * | 12/2004 | Lee | H01L 23/544 257/E23.179 |
| 6,939,727 B1 | 9/2005 | Allen, III et al. | |
| 7,343,214 B2 | 3/2008 | Koh | |
| 7,440,860 B2 | 10/2008 | Raitter | |
| 7,615,404 B2 | 11/2009 | Loon | |
| 7,653,453 B2 | 1/2010 | McGushion | |
| 2002/0036235 A1 | 3/2002 | Kudo | |
| 2002/0083374 A1 | 6/2002 | Hinds et al. | |
| 2005/0222817 A1 | 10/2005 | Achacoso et al. | |
| 2005/0283266 A1 | 12/2005 | Geraci et al. | |
| 2007/0016322 A1 | 1/2007 | Kataoka | |
| 2007/0171080 A1 | 7/2007 | Muirhead | |
| 2008/0098007 A1 | 4/2008 | Nakamura | |
| 2008/0148365 A1 | 6/2008 | Yoshida et al. | |
| 2008/0237353 A1 | 10/2008 | Lau et al. | |
| 2009/0254535 A1 | 10/2009 | Eickelmann et al. | |
| 2009/0283878 A1 | 11/2009 | Fan et al. | |
| 2009/0315193 A1 | 12/2009 | Ortner | |
| 2009/0323928 A1 | 12/2009 | Kerschbaum et al. | |
| 2010/0044858 A1 | 2/2010 | Cohn et al. | |
| 2011/0259951 A1 * | 10/2011 | Meyerson | H01L 23/544 235/375 |
| 2013/0006564 A1 * | 1/2013 | Chavet | H01L 21/67294 702/81 |

FOREIGN PATENT DOCUMENTS

| | | |
|---|---|---|
| EP | 1478022 A1 | 11/2004 |
| EP | 1688810 A1 | 8/2006 |
| JP | 7335510 | 12/1995 |
| JP | H07335510 | 12/1995 |
| JP | H1126333 | 1/1999 |
| JP | 2004127069 A | 4/2004 |
| JP | 2004193189 | 7/2004 |
| JP | 2007526624 | 9/2007 |
| WO | 2005001909 A2 | 1/2005 |
| WO | 2005114710 | 12/2005 |

OTHER PUBLICATIONS

Abstract of Riordan et al., 2000, 2pp.
Response to Office Action filed Aug. 18, 2015 in Korean Patent Application No. 10-2012-7009314.
Office Action dated Sep. 21, 2015 in Korean Patent Application No. 10-2014-7024433.
Office Action dated Nov. 23, 2015 in Taiwan Patent Application No. 103126254.
Office Action dated Dec. 15, 2015 in Japanese Patent Application No. 2015-002628.
English language Abstract for JP2004193189 published Jul. 8, 2004.
English language Abstract for WO2005114710 published Dec. 1, 2005.
Response to Office Action filed Dec. 16, 2015 in Korean Patent Application No. 10-2014-7024433.
Office Action dated Jan. 21, 2016 in Korean Patent Application No. 10-2014-7024433.
Response to Office Action filed Apr. 7, 2015 in European Patent Application No. 10858032.5.
Response to Office Action filed May 4, 2015 in Korean Patent Application No. 10-2012-7009314.
Response to Office Action filed May 19, 2015 in Korean Patent Application No. 10-2014-7024433.
Voluntary Amendment filed Aug. 10, 2015 in European Patent Application No. 10858032.5.
Office Action filed Jun. 18, 2015 in Korean Patent Application No. 10-2012-7009314.
Response to Office Action filed Nov. 22, 2013 in Korean Patent Application No. 10-2012-7009314.
Office Action dated Dec. 19, 2014 in Korean Patent Application No. 10-2014-7024433.
Decision of Rejection dated Jan. 29, 2015 in Korean Patent Application No. 10-2012-7009314.
Response to Office Action filed Mar. 14, 2014 in Taiwan Patent Application No. 100135930.
Claims as Amended after Telephone Notification filed Mar. 26, 2014 in Chinese Patent Application No. 201080040554.4.
Hutchins, IBM TDB, "Semiconductor Chip Traceability Method," Oct. 1, 1980, TDB 10-80, p. 1829.
Bronte et al., IBM TDB, "Chip Identification Writing System," Mar. 1, 1985, TDB 3-85, p. 5883-5890.
Disclosed Anonymously, "Method for die-level traceability using die-surface holographic imaging," IPCOM000144766D, IP.com Electronic Publication: Jan. 6, 2007.
Ryan, PM, IBM TDB, "Automatic Serialization of Chips for Identification and Traceability," Jun. 1, 1979, TDB 06-79, p. 108-111.
Komatsu Engineering Corp., "Introducing the World's First 'Chip ID marker' for Semiconductor Chips," May 2009, retrieved from Internet Mar. 4, 2010: <http://www.komatsu.com/CompanyInfo/press/2009051218350909077.html>.
Cunningham, "Wafer Level Die Marking and Substrate Mapping Standards," 12th Annual KGD Packaging & Test Workshop, Sep. 12-15, 2005.
National Semiconductor, "Device Marking Conventions," 2005, retrieved from the Internet Mar. 4, 2010: <http://www.national.com/analog/quality/marking_conventions>.
Spede Technologies, "Traceability for Finished Product," Feb. 2010.
Spirit 21 Inc., "Sphincs: The Next Generation System of Traceability," Apr. 2008.
Dommel, "Circuit-level traceability: recent software developments help to monitor placement machines," Oct. 1, 2003, Circuits Assembly ISSN: 1054-0407.
Huntley, "Single Device Tracking: A Cost-Benefit Analysis," Kinesys Software, Reprinted from Chip Scale Review, Jul. 2007.
Camstar Manufacturing, "Manufacturing Execution with Camstar—Camstar Manufacturing," 2010, retrieved from the Internet Apr. 20, 2010: <http://www.camstar.com/Products/CamstarManufacturing.aspx>.
Office Action dated Jul. 8, 2014 in Japanese Patent Application No. 2013-530524.
English language Abstract for JP7335510 published on Dec. 22, 1995.
English language Abstract for JP2004127069 published on Apr. 22, 2004.
Supplementary European Search Report dated Aug. 29, 2014 in European Patent Application No. 10858032.5.
English language Abstract for DE4340223 published on Jun. 1, 1994.
Office Action dated Mar. 29, 2014 in Korean Patent Application No. 10-2012-7009314.
Response to First Office Action filed Aug. 20, 2013 in Chinese Patent Application No. 201080040554.4.
Reply to Communication filed Aug. 29, 2013 in European Patent Application No. 10858032.5.
Office Action dated Sep. 16, 2013 in Taiwan Patent Application No. 100135930.
Communication Pursuant to Rules 161(2) and 162 EPC dated May 3, 2013 in European Patent Application No. 10858032.5.
Office Action dated Dec. 10, 2013 in Chinese Patent Application No. 201080040554.4.

(56) References Cited

OTHER PUBLICATIONS

Response to Office Action filed Feb. 11, 2014 in Chinese Patent Application No. 201080040554.4.
First Office Action dated Jun. 6, 2013 in Chinese Patent Application No. 201080040554.4.
Office Action dated May 23, 2013 in Korean Patent Application No. 10-2012-7009314.
International Search Report and Written Opinion dated Jul. 14, 2011 in International Patent Application No. PCT/CN2010/077568.
Response to Office Action filed Aug. 29, 2014 in Korean Patent Application No. 10-2012-7009314.
Non-Final Rejection dated Apr. 28, 2015 in U.S. Appl. No. 13/634,068.
Amendment filed Sep. 10, 2015 in U.S. Appl. No. 13/634,068.
Final Rejection dated Nov. 12, 2015 in U.S. Appl. No. 13/634,068.
Amendment dated Mar. 4, 2016 in U.S. Appl. No. 13/634,068.
Final Rejection dated Mar. 29, 2016 in U.S. Appl. No. 13/634,068.
Response to Office Action filed Feb. 24, 2016 in Taiwan Patent Application No. 103126254.
Response to Office Action filed Mar. 8, 2016 in Japanese Patent Application No. 2015-002628.
Office Action dated Mar. 31, 2016 in European Patent Application No. 10858032.5.
Office Action dated Apr. 14, 2016 in Chinese Patent Application No. 201410195056.7.
Office Action dated Jun. 1, 2016 in Korean Patent Application No. 10-2016-7006572.
Response to Office Action filed Aug. 10, 2016 in European Patent Application No. 10858032.5.
Office Action dated Aug. 23, 2016 in Japanese Patent Application No. 2015-002628.
English Abstract for JPH07335510 published Dec. 22, 1995.
English Abstract for JPH1126333 published Jan. 29, 1999.
English Abstract for JP2007526624 published Sep. 13, 2007.
Response to Office Action filed Aug. 1, 2016 in Korean Patent Application No. 10-2016-7006572.
Response to Office Action filed Aug. 29, 2016 in Chinese Patent Application No. 201410195056.7.
Office Action dated Nov. 21, 2016 in U.S. Appl. No. 13/634,068.
Office Action dated Dec. 16, 2016 in Chinese Patent Application No. 201410195056.7.
Office Action dated Dec. 20, 2016 in European Patent Application No. 10858032.5.
Response to Office Action filed Feb. 21, 2017 in Japanese Patent Application No. 2015-002628.
Response to Office Action filed Mar. 9, 2017 in U.S. Appl. No. 13/634,068.
Response to Office Action filed Apr. 30, 2017 in Chinese Patent Application No. 201410195056.7.
Final Office Action dated May 15, 2017 in U.S. Appl. No. 13/634,068.
Amendment filed Jun. 16, 2017, and English translation of claims as amended, in Japanese Patent Application No. 2015-002628.
Response to Office Action filed Jun. 30, 2017 in European Patent Application No. 10858032.5.

* cited by examiner

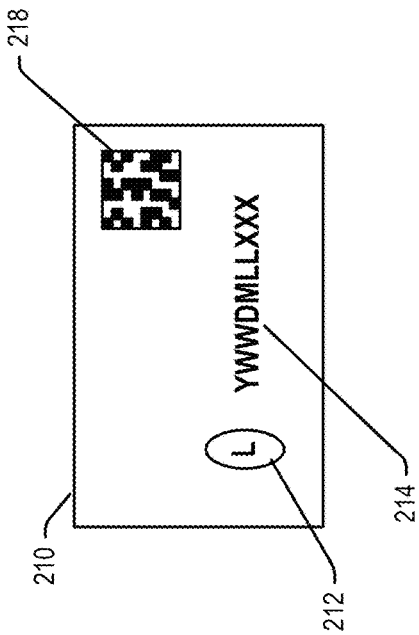

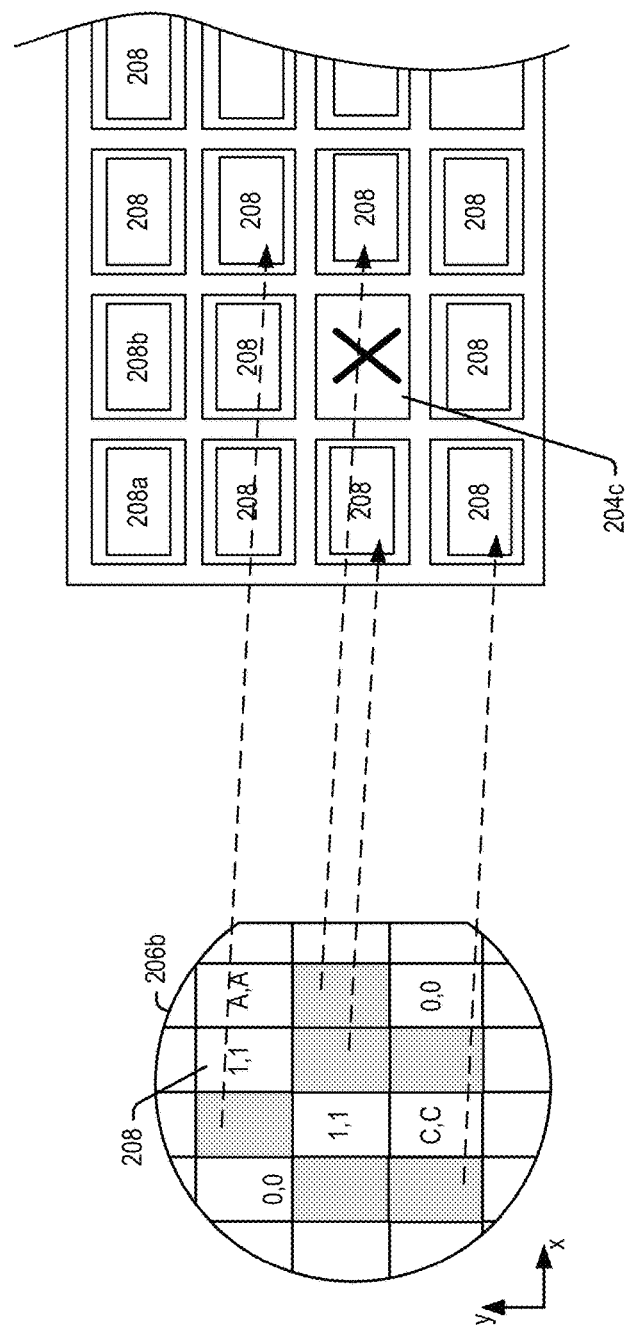
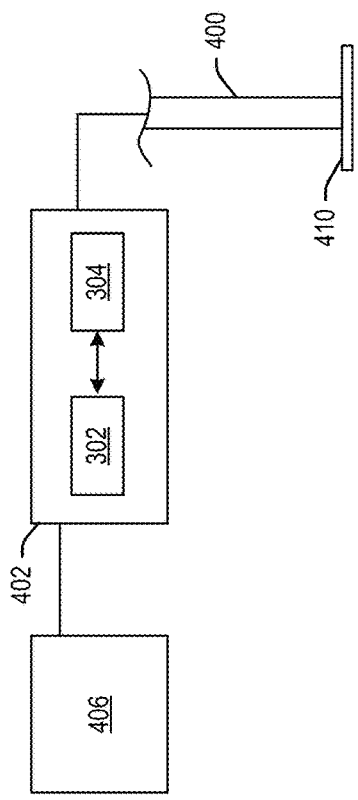
Fig. 16

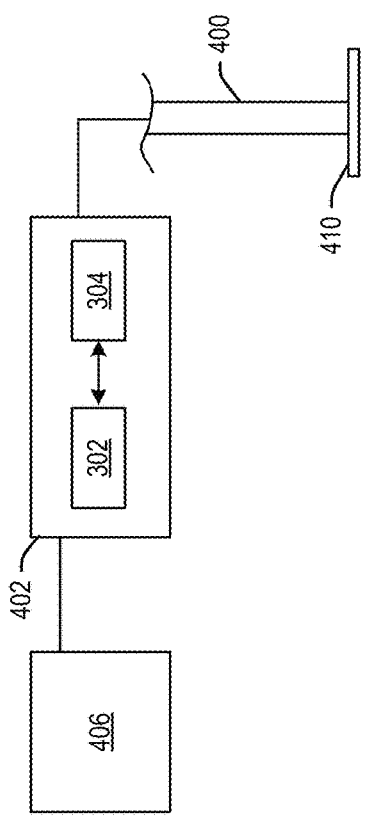
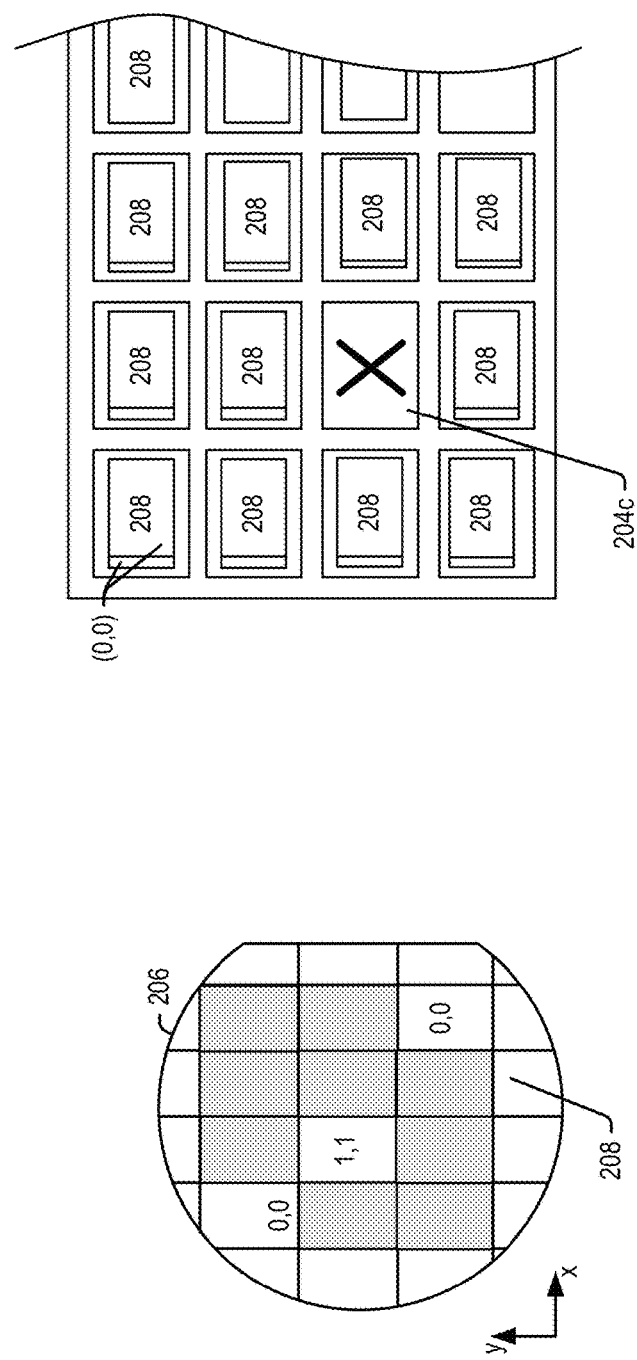
Fig. 17

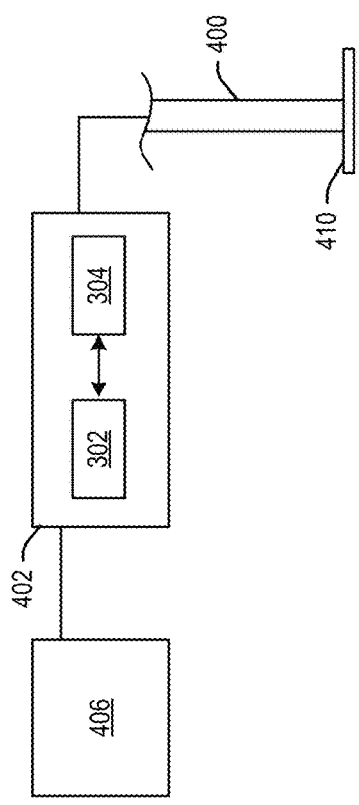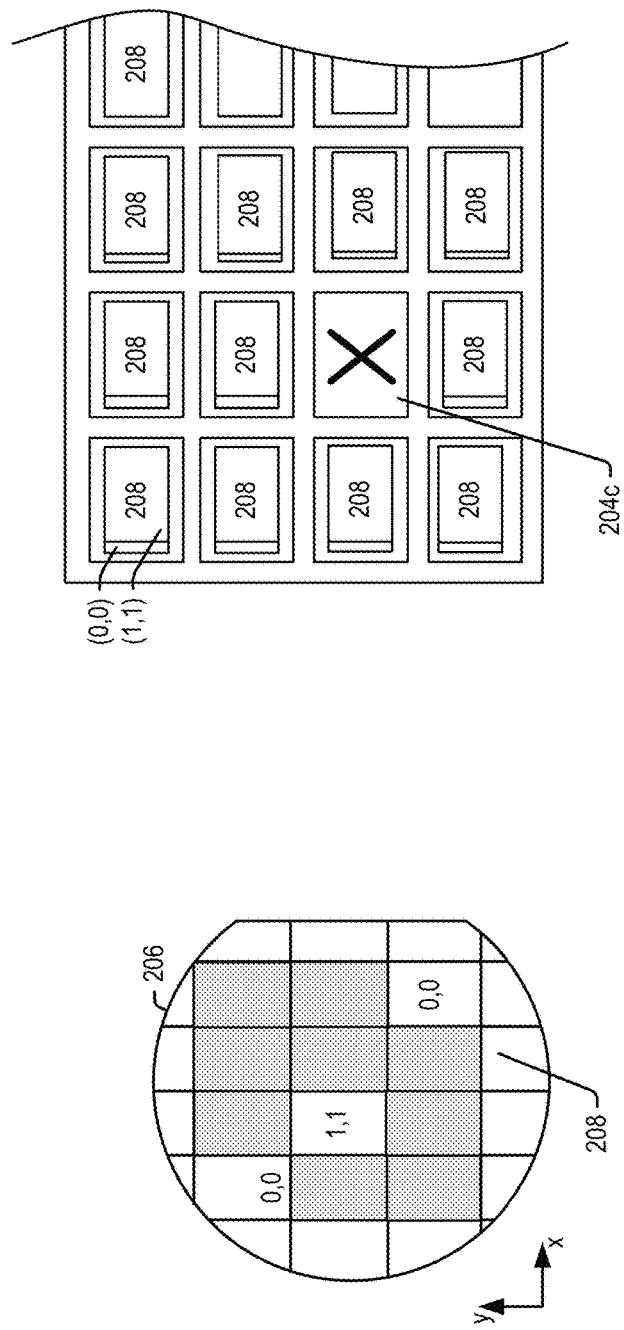
Fig. 18

DISCRETE COMPONENT BACKWARD TRACEABILITY AND SEMICONDUCTOR DEVICE FORWARD TRACEABILITY

RELATED APPLICATION

The application is a continuation-in-part application of application Ser. No. 13/634,068, entitled "Discrete Component Backward Traceability And Semiconductor Device Forward Traceability," filed Sep. 11, 2012, which application claims priority under 35 U.S.C. 371(c) to PCT Application No. PCT/CN2010/077568, filed Oct. 4, 2010, and which application is incorporated by reference herein in its entirety.

BACKGROUND OF THE INVENTION

Field

The present technology relates to fabrication of semiconductor devices.

Description of Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Prior art FIGS. 1 and 2 respectively show a flowchart and schematic representation of steps in the production of semiconductor device memory cards. Given the large number of components which are assembled into a memory card, and the tremendous scale on which memory cards are produced within a semiconductor fabrication plant, it is important to provide a methodology for tracking semiconductor devices as they progress through the memory card production process. Manufacturing execution systems (MES) are known which receive information in real time from process tools and fab personnel to manage and, to an extent, track the production of memory cards. An MES maintains a database of the fabrication process which allows fab personnel to track semiconductor devices during the production process and also may be used to trace the source of problems should a defect be found in one or more assembled semiconductor devices. One example of a known MES platform is that from Camstar Inc. (owned by Siemens), Charlotte, N.C., USA. Camstar Inc. provides an MES platform under the name Camstar Manufacturing, and a quality management system under the name Camstar Quality. Other known platforms for managing the flow in a semiconductor memory card plant include Tango production monitoring suite by CyberDaemons Inc. of Hsinchu, Taiwan and an assembly line production (Cellmap) manager by Values First Consulting, Penang, Malaysia.

Referring to prior art FIGS. 1 and 2, memory die wafer lots 70 and controller die lot 72 are received in a memory card fabrication plant from wafer piece manufacturers. The wafers arrive with the integrated circuits defined thereon by the wafer piece manufacturers so that each memory die wafer piece includes a plurality of memory die, and each controller die wafer piece includes a plurality of controller die. In the embodiment shown in FIG. 2, a semiconductor device is being fabricated including a pair of memory die. Thus, two memory die wafer lots 70a and 70b are shown. It is also known to form semiconductor devices with one or more than two memory die. The wafer lot 70a used for the bottom memory die may be referred to as the wafer mother lot, while wafer lot(s) used for memory die above the bottom die may be referred to as the wafer sublots. Substrate lots 74 are also received in the memory card fabrication plant from a substrate manufacturer. The substrates in a substrate lot 74 may for example be a printed circuit board (PCB), leadframe or tape automated bonding (TAB) tape.

In order to prepare the wafer pieces in the wafer lots 70, 72 for affixation to a substrate in substrate lot 74, each wafer piece may have a protective tape applied to its active surface (the surface including the integrated circuits) and is then mounted to a chuck (not shown), active side down in step 20. Thereafter, a backgrind step 22 may be performed on the each wafer piece to thin the wafer down to a desired thickness. After backgrind step 22, the wafer pieces may be transferred to another tool where they are diced, for example by saw or laser, in step 24 so that they may be picked and placed onto the substrate.

In parallel with the die preparation steps, the substrate strips are received from the substrate strip manufacturer and processed. The strips are received in step 26. The strip manufacturer may mark individual substrates on the strip which were identified as bad substrates and unusable (such as substrates 204c shown with a "X" in FIG. 7). Individual substrates may also come from the strip manufacturer with an x-y location etched on the back of the substrate site. For example, in a 4×20 substrate strip, the substrates may be marked with A1 to A20, B1 to B20, C1 to C20 and D1 to D20. In step 28, the substrate strip may be laser marked with an ID. The laser marker also will scan the whole strip to identify the "X" out bad units.

In step 28, passive components may be mounted on the substrates of the strip in a surface mounting process. The solder paste may be applied in step 30. The passive components, also referred to herein as passives, may be mounted in step 32, and the solder may reflowed/cleaned in a step 34. The passives may include for example resistors and capacitors.

In step 42, the memory die and a controller die may be mounted on a substrate at a die attach tool 76. The tool 76 makes use of a known good die (KGD) map 78 which defines good and bad die for each wafer piece used. In particular, each die on each wafer piece in wafer lots 70, 72 may be operationally tested and given a rating such as 0,0 (flawless), A,A (good) or 1,1 (bad). The KGD map 78 is used by the die attach tool so that bad die on a wafer piece are ignored. In step 42, memory die and typically a controller die are mounted on a substrate to form a semiconductor device. As used herein, the term "device" refers to an assembly of a substrate, one or more semiconductor die on the substrate and, possibly, passive components on the substrate. The respective die, substrate and/or passives within a device may be referred to herein as "discrete components" of the semiconductor device.

Following the mounting of the die and passives on a substrate, the resulting device may then be wire bonded in step 48. The wire bonding step 48 is a time consuming process. As such, the device assembly lots may be split into a plurality of device assembly sublots so that wire bonding may be performed by a plurality of wire bonding tools 80 simultaneously (the number of wire bonding tools in FIG. 2 is by way of example only). In the wire bonding step 48, die bond pads on each of the die mounted to a substrate may be electrically coupled to contact pads on the substrate.

Following the wire bond step 48, the devices in the respective device assembly sublots may be encapsulated in a molding compound (step 50) in one or more tools 82, laser marked with an identifier (step 54) in one or more tools 84, and then singulated (step 56) in one or more tools 86. FIG. 2 shows the device assembly sublots remaining separated through each of these steps. However, one or more of the device assembly sublots may be reassembled into the device assembly lot following any of the steps 48 through 56.

The laser marking step 54 may be significant in that it allows information regarding a device assembly lot or sublot to be uploaded and tracked by the MES platform managing flow within the card fabrication plant. Prior art FIG. 3 shows an example of a conventional laser mark placed on the devices in a device assembly lot or sublot. The laser mark may include for example a logo and alphanumeric characters. The alphanumeric characters may include a plant code identifying the plant where the semiconductor device was made, a date code indicating when the semiconductor device was made, an MES lot or sublot number assigned to each device assembly lot or sublot, and a device ID code identifying the type of semiconductor package the device is. The information from the laser mark for a device assembly lot or sublot is assigned and stored by the MES, and used for device tracking and traceability.

Traditional MES platforms using this methodology have several limitations. First, the MES platform does not uniquely identify specific devices. At most, the MES assembly sublot number is unique to an entire device assembly sublot that went through a particular set of tools. Each particular device in such an MES assembly sublot will have the same identification code on its surface and be identified by the same identification code stored in the MES platform. Second, in part because of the generic marking of entire assembly sublots, there is no specific discrete component information directly associated with a specific device. That is, there is no direct link between a device's identification code and the semiconductor die, substrate and/or passive components used in that device.

As one consequence, when a problem with a device is detected during or after fabrication, conventional systems have limited ability find the source of the problem. When a problem with a device occurs, prior art systems may allow identification of an MES assembly sublot from which the problem device came. From the knowledge of the MES assembly sublot, it may be possible to determine what processes the problem device went through. From this, further research could reveal a specific wafer lot, and possibly reveal where a problem occurred. However, such research is time consuming and does not provide any specific identification or information on the discrete components from which the semiconductor device was formed.

Referring again to the flowchart and schematic representation of FIGS. 1 and 2, after singulation, semiconductor devices 90 may be inspected (step 60) and then put through one or more tests in step 62. These tests may include for example burn-in and memory read-write testing at high and low temperatures. Typically, semiconductor devices 90 from a number of device assembly lots are combined in the testing step. It is known to perform tests on 30,000 to 50,000 devices 90 from a plurality of device assembly lots. There is an N:1 consolidation of device assembly lots into a single device test lot, where N may for example be 25 device assembly lots.

The devices from respective assembly lots are reshuffled into different bins, depending on how the devices performed in the testing operations. In one example, it is known to divide the devices into seven bins (1-7), where devices classified in bins 1-4 have satisfactorily passed the testing operations and are passed on to a card test, described below. Devices classified in bins 5-7 failed the testing operation for one reason or another, and are subjected to a reclaim step 64 where they are retested. The reclaim operations will vary depending on whether a device was classified in bin 5, bin 6 or bin 7. A device may go through multiple reclaim processes. If, after one or more of these reclaim processes, a device is found to operate satisfactorily, it may be reclassified into one of bins 1-4 and passed on to the card test.

The card test in step 66 may be similar to the memory test in step 62, however content may be written to each device and its capabilities tested. Although not shown in FIG. 2, the card test may have a similar binning operation, where devices classified in certain bins are submitted for retest in a reclaim operation in step 68. Devices 90 which pass the card test may undergo some final inspection and processing steps (not shown) and then shipped.

In semiconductor memory card fabrication plants, the memory cards go through a number of distinct processes as indicated in FIG. 2, including in general the KGD (known good die) process, the card assembly process, the memory test process and the card/system test process. Given the consolidation and shuffling of devices 90 from the assembly process to the memory test process, and then again from the memory test process to the card/system test process, it is difficult and time consuming, if it is possible at all, to trace devices which are identified as problematic in the memory or card test phase using a conventional MES. This is in part due to the fact that memory devices are not marked with unique IDs, and thus, there is no record of how a specific semiconductor device performed in the testing operations.

DESCRIPTION OF THE DRAWINGS

FIG. 9 is an illustration of a semiconductor device including a unique identifier.

FIG. 10 is a table including information on a semiconductor device and its discrete components according to an embodiment of the present technology.

FIGS. 14-18 illustrate a system for generating a strip map associating identified semiconductor die and/or passives with an identified substrate.

DETAILED DESCRIPTION

Embodiments will now be described with reference to FIGS. 4 through 15, which relate to a system enabling backward traceability of a semiconductor device fabrication process to a single semiconductor die or other discrete component, and forward traceability of individual devices and components through memory and card tests. It is understood that the present technology may be embodied in many different forms and should not be construed as being limited to the embodiments set forth herein. Rather, these embodiments are provided so that this disclosure will be thorough and complete and will fully convey the invention to those skilled in the art. Indeed, the present system is intended to cover alternatives, modifications and equivalents of these embodiments, which are included within the scope and spirit of the present system as defined by the appended claims.

In general, the present technology provides backward and forward traceability by a methodology which uniquely identifies each semiconductor device, and which provides an association between the uniquely identified semiconductor device and the discrete components (die, substrate and/or passives) that are used in that device. The unique identification and marking of a semiconductor device enables the semiconductor device, and the discrete components within that device, to be tracked and traced through each process and test in the production of a memory card from that device.

The information relating to a semiconductor device, including its unique ID and the specific component identifiers, are stored in a database, referred to herein as an MES database. In the description below, the MES database stores backward and forward traceability data in addition to other MES data. However, it is understood that storage of data relating to card fabrication may be distributed across more than one database in a variety of ways. In one such example shown in the block diagram of FIG. 13, there are two databases: a traceability database 306a for storing all backward and forward traceability data, generated as explained below, and a separate MES database 306b for storing other MES-related data. As indicated, the description that follows generally refers to a single MES database which stores backward and forward traceability data as well as other MES data.

Figure 1:
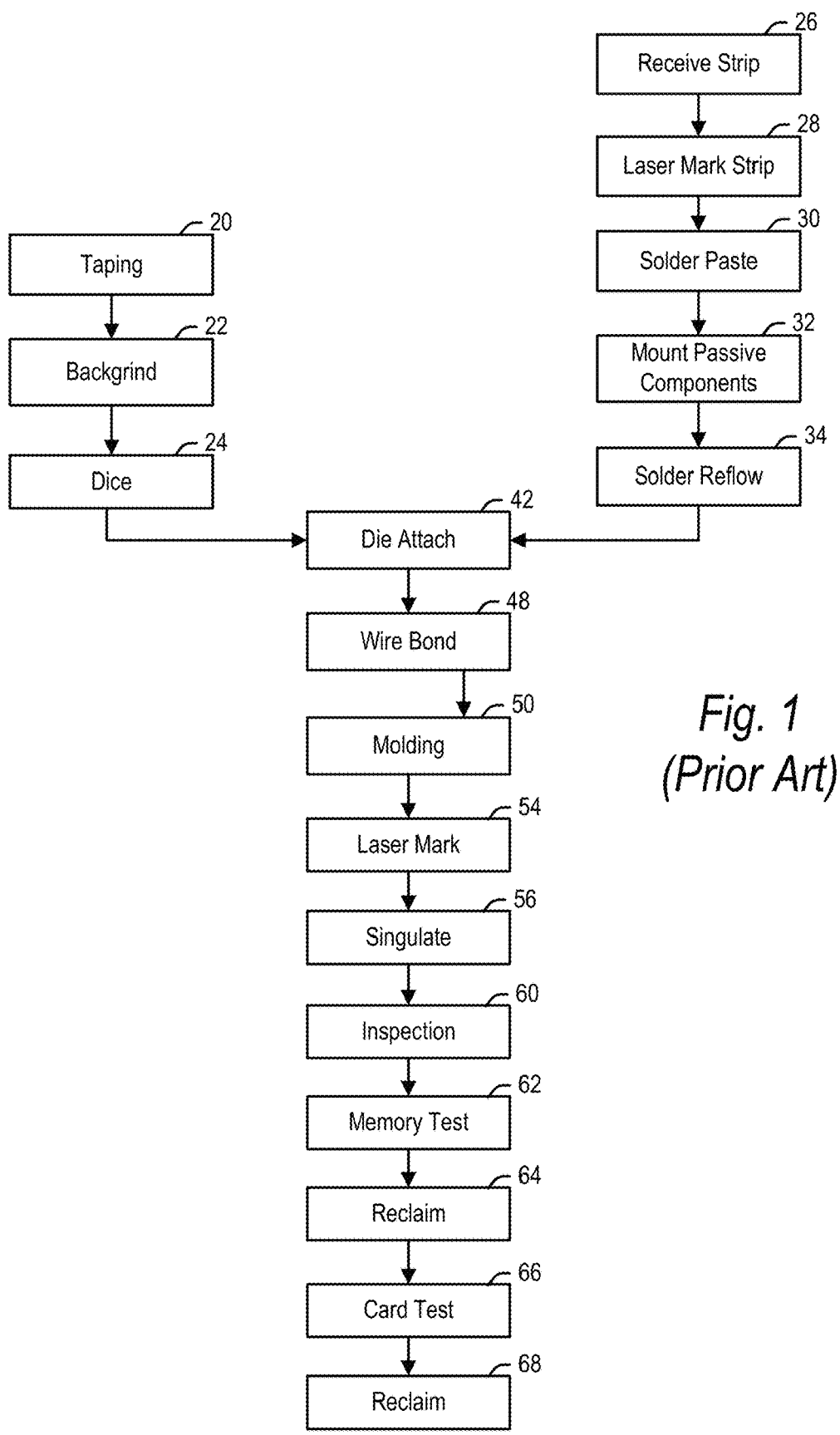
FIG. 1 is a prior art flowchart showing an assembly process of a semiconductor device memory card.
Figure 2:
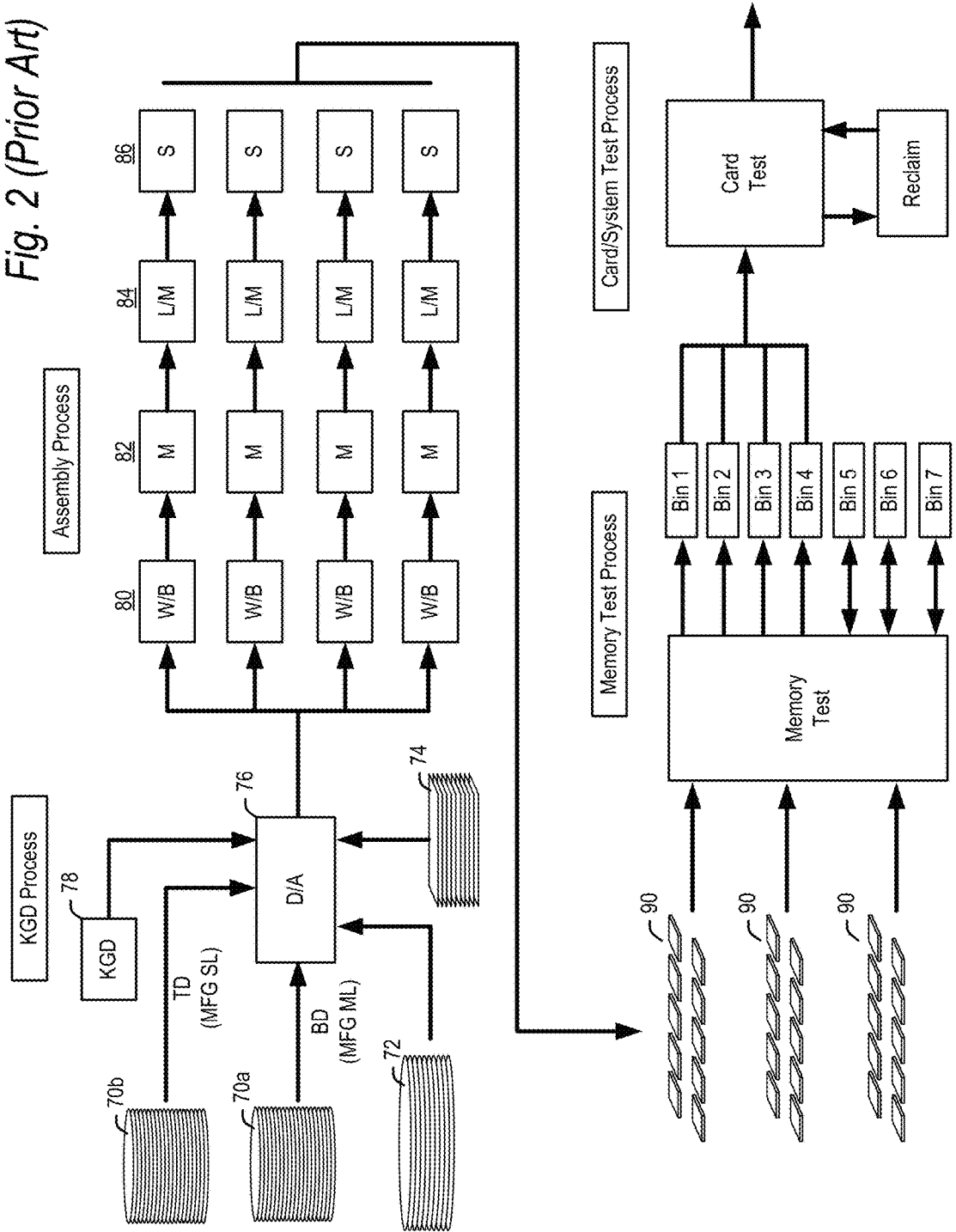
FIG. 2 is a prior art schematic representation of an assembly process of a semiconductor device memory card.
Figure 3:
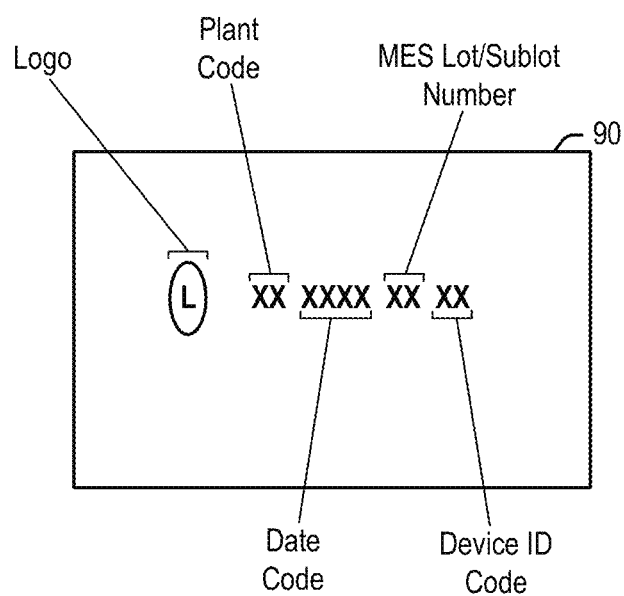
FIG. 3 is a prior art illustration of a semiconductor device including an MES marking.
Figure 4:
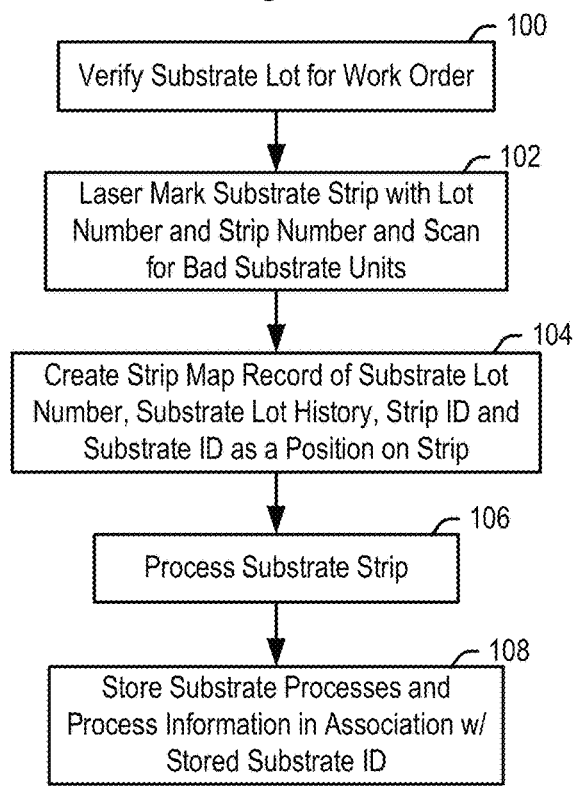
FIG. 4 is a flowchart of an embodiment of the present technology for processing a substrate strip.
Figure 5:
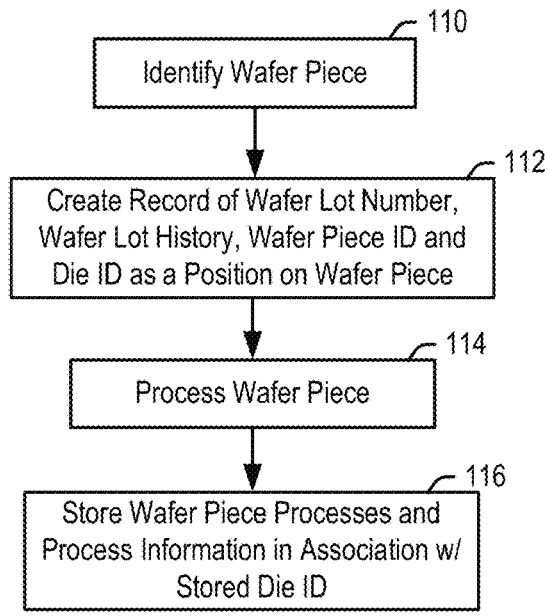
FIG. 5 is a flowchart of an embodiment of the present technology for processing a semiconductor wafer piece.
Figure 6:
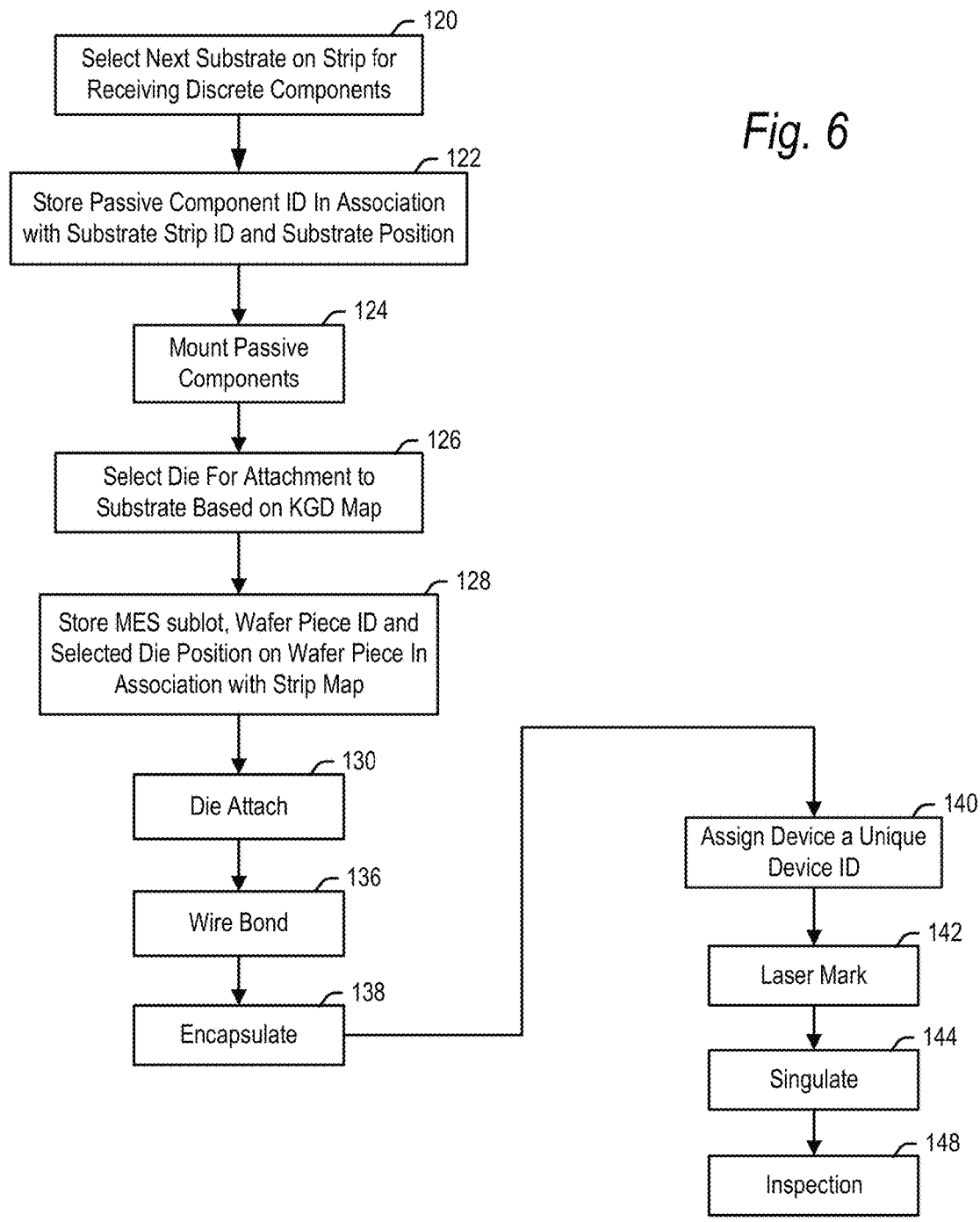
FIG. 6 is a flowchart of an embodiment of the present technology for forming a semiconductor device.

An embodiment of the present technology will now be described with reference to the flowcharts of FIGS. 4 through 6. In embodiments, information regarding discrete components (substrates, semiconductor die and/or passive components) may be stored in the MES database prior to their assembly into a semiconductor device. As explained below, when the discrete components get assembled into a semiconductor device, this information for the discrete components may be associated in the MES database with the device. However, as a precursor to this association, information regarding the discrete components may be identified and stored.

The fabrication process may begin by defining a work order for production of a given number and type of memory card. This may occur for example days or weeks before the actual fabrication begins. Each memory card is made from a particular type of substrate, memory die, controller die and other discrete components. When a work order is defined, the discrete components that will be used for the work order are also specified and stored in the MES database. When discrete components such as substrate lots and wafer lots are received in the fabrication plant, they are labeled with information such as the component manufacturer, date and place of manufacture and a lot number assigned to that component lot. This information is scanned upon receipt (or at some point prior to use in a work order) and uploaded to the MES database. Thus, when a work order is defined, the specific lot numbers of the discrete components that will be used for that work order are also specified.

Figure 7:
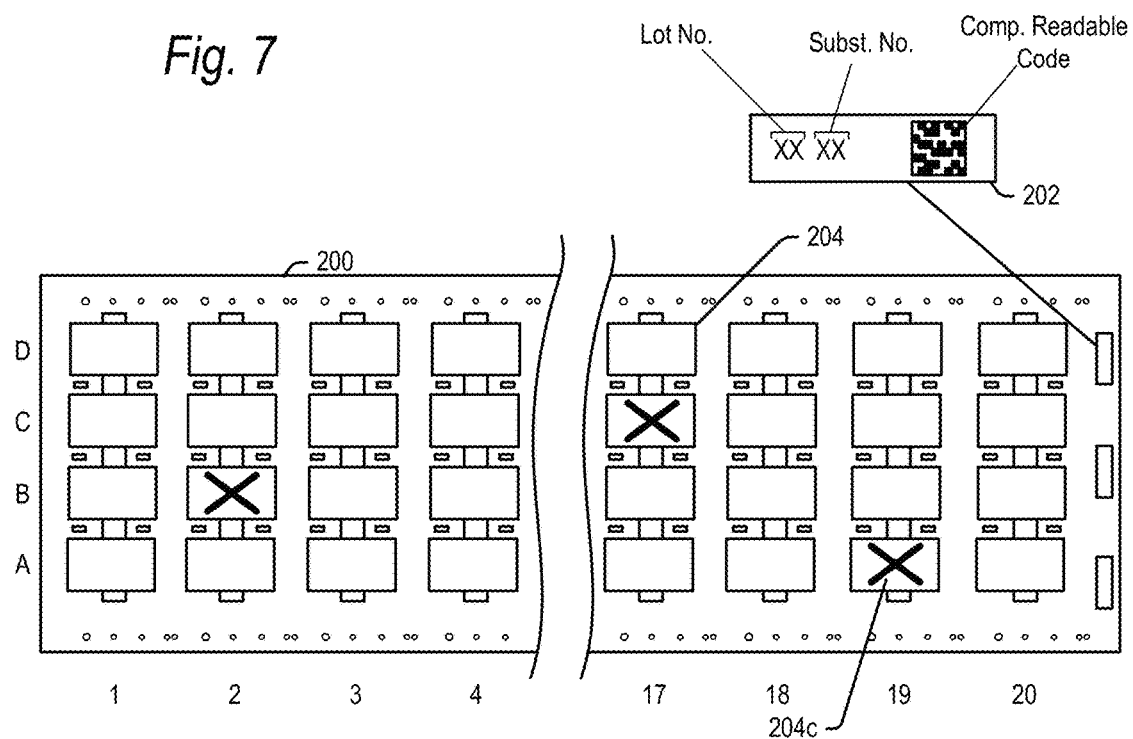
FIG. 7 is an illustration of a substrate including a marking according to an embodiment of the present technology.

When a work order is to begin, a substrate lot is scanned in a step 100 to verify it is a proper substrate lot for that work order. The individual substrate strips from that substrate lot may then be processed. It is understood that a variety of different substrates may be used with the present technology, including for example a PCB, a leadframe and/or a TAB tape. The example of FIG. 7 shows a strip 200 of substrates 204 (one of which is marked in FIG. 7). Although any of a wide variety of substrates may be used, the strip 200 shown in FIG. 7 may for example be for MicroSD memory cards having eighty substrates 204 in a 4×20 array. The strip 200 shown is by way of example only and strip 200 may come in other shapes, sizes and configurations. While a strip of substrates is described hereinafter, it is understood that the individual substrates may be other substrates and may alternatively be formed of a panel, roll or other grouping of substrates.

Figure 13:
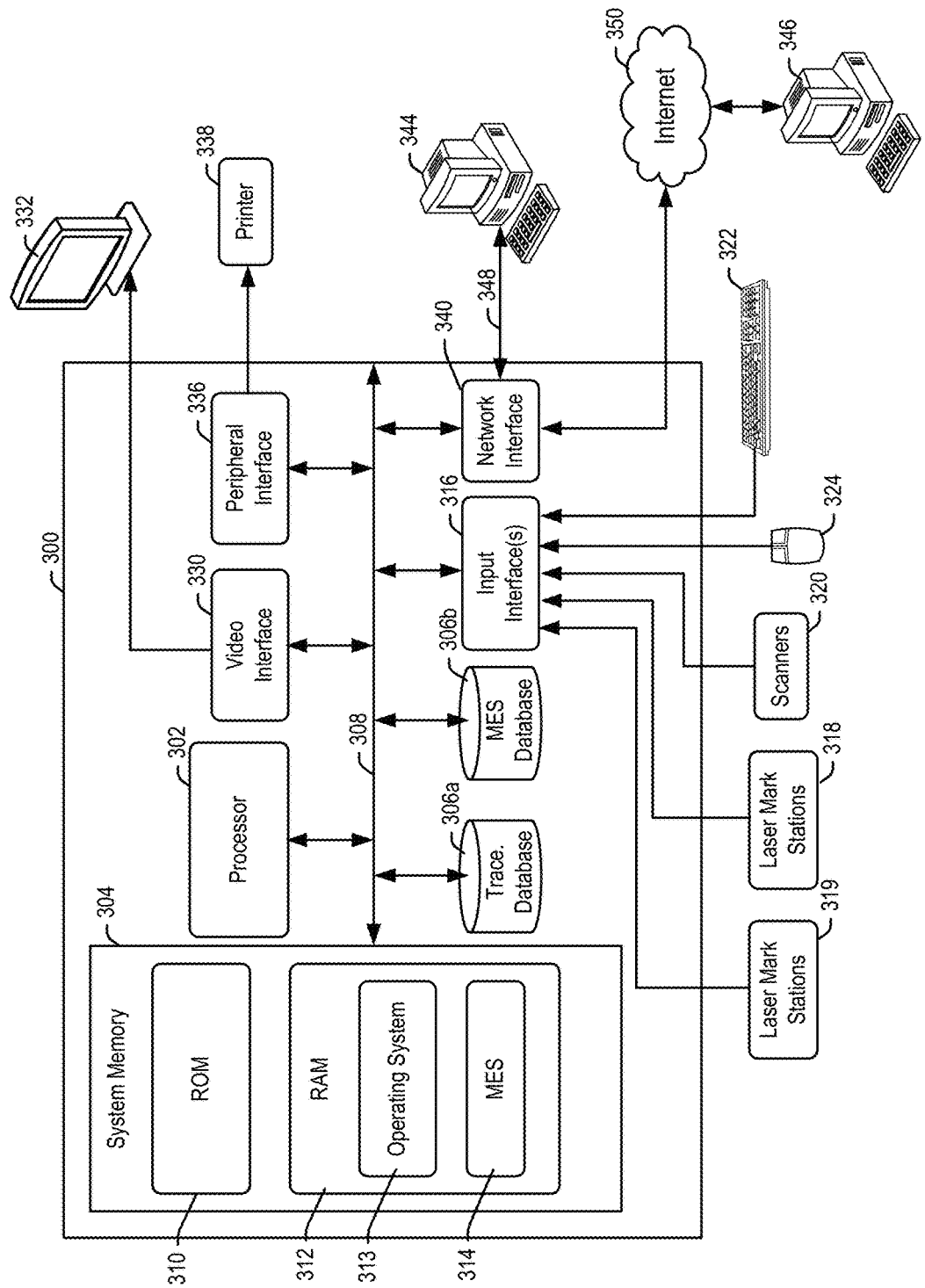
FIG. 13 is a block diagram of a sample server for implementing aspects of the present technology.
Figure 14:
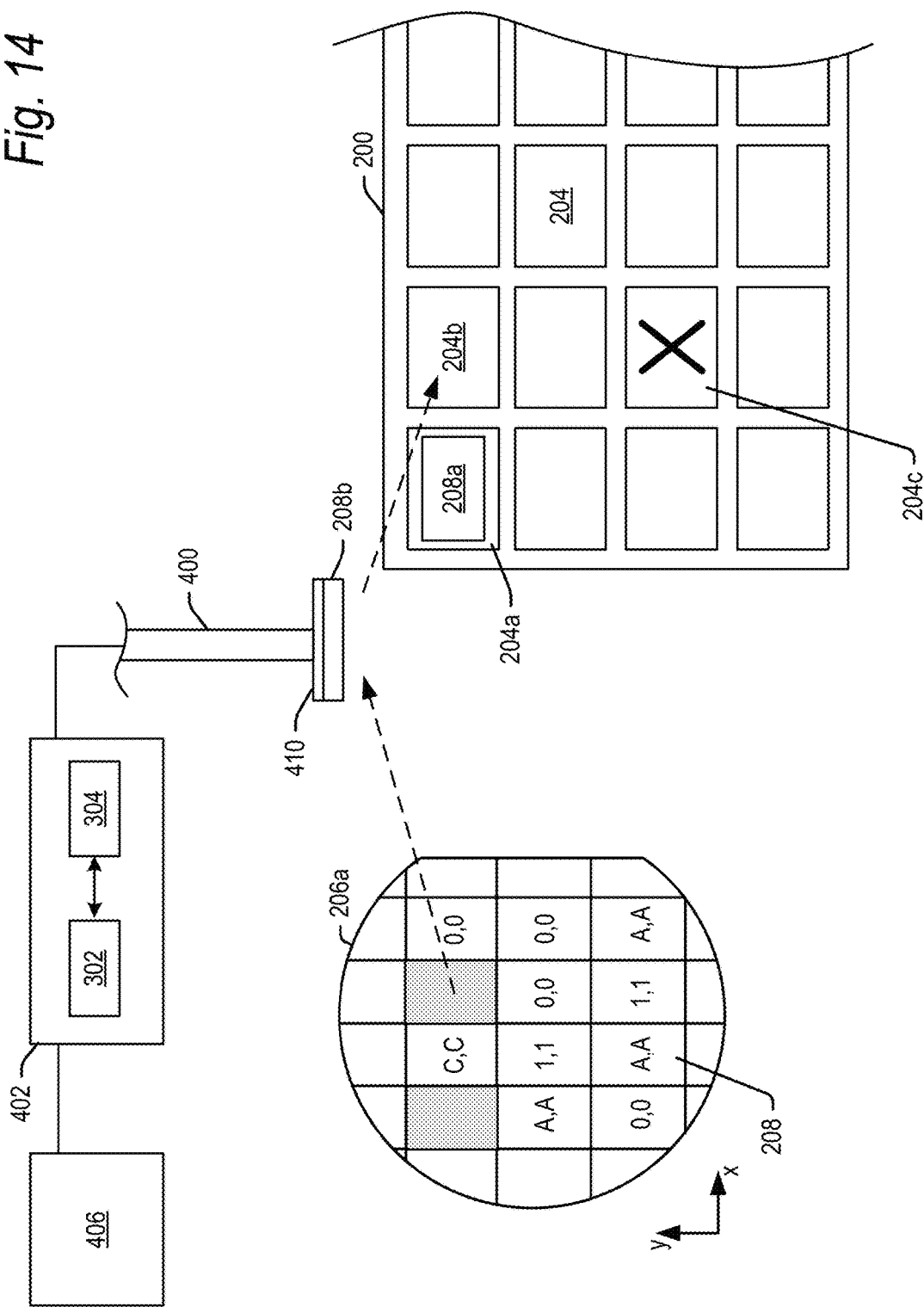

In step 102, each strip 200 (or other grouping of substrates 204) may be laser marked with its substrate lot number and a specific ID unique to that strip 200. In embodiments, the MES system includes a control program which receives data and feedback from various tools and components within the card fabrication plant and stores the information in the MES database. Four components providing data and feedback to the MES control program are the substrate strip laser mark stations 318 (FIG. 13), molded strip laser marker 319 (FIG. 13), scanners 320 (FIG. 13) and a die bond mechanism 400 (FIG. 14).

In step 102, the laser mark station 318 associated with substrate processing may generate and assign each substrate strip 200 a unique ID. As one example, the laser mark station may assign successive strip identifiers as successive substrate strips 200 are processed. The laser mark station 318 then laser marks each substrate with the known substrate lot number and the substrate strip ID that it generated. It is understood that the unique strip identifier for each substrate strip 200 may be generated by another component within the MES system. The component may then communicate the unique substrate strip ID to the laser mark station, which marks each substrate strip 200 with the substrate lot and substrate strip identifier.

Each instance of a substrate strip 200 may include a laser marking 202 including a substrate lot number (generic to all strips in that substrate lot) and a substrate strip identifier that is unique to that specific strip. The substrate lot number and unique strip identifier are shown in FIG. 7 as a pair of two digit alphanumeric characters. It is understood that the substrate lot number and/or the unique strip identifier may be represented with more digits, or in different ways, than is shown in FIG. 7 in further embodiments.

In a non-limiting example, each digit of a two digit alphanumeric identifier (of the substrate lot number and/or the unique strip identifier) may have 33 possible values. The 33 possible values come from 10 numeric values (0-9) and 23 letters of the alphabet (A-Z, minus the letters B, O and I, as these may be confused with 8, 0 and 1, respectively). Thus, a digit may be any of 33 possible characters for each digit. A two digit number may thus represent 33×33=1089 possible unique identifications for a substrate sublot, and 1089 possible unique strip identifiers for each substrate sublot. It is understood that a two digit number may be comprised of digits having more than or less than 33 possible values in further embodiments.

The laser marking 202 may further include a machine-readable code having the substrate lot number and unique strip identifier information in a form that is readable by a computer scanner. The machine-readable code shown in FIG. 7 is a two-dimensional matrix code, but it is understood that the computer readable code may be a one-dimensional bar code or any other marking in which the substrate lot number and unique strip identifier may be encoded in such a way so as to be understood by a computing device. In embodiments, it is conceivable that a computer can read alphanumeric text. In such embodiments, the separate matrix or other code in addition to the text may be omitted.

The markings of step 102 may be made by laser or other known printing operation. Instead of marking, adhesive labels including the above-described information may be affixed to each substrate strip 200. FIG. 7 shows three instances of laser marking 202, at a leading edge of the substrate strip 200. Each instance may be identical to each other for redundancy and to ensure that at least one will be read upon the strip entering a processing or test station. It is understood that the laser marking 202 may be provided at other locations on substrate strip 200 in further embodiments. As also shown in FIG. 7, the substrate strip laser mark station 318 may also scan the substrate strip for X out bad substrate units 204c in step 102.

In step 104, the laser mark station 318 which generated the unique strip ID may further generate an initial version of a data map, referred herein as a strip map. The initial version of the strip map may include the substrate lot, substrate lot history, unique strip ID and a unique substrate ID of each substrate on a strip 200. As noted above, when a substrate lot first enters the card fabrication plant, an ID for that lot, as well as a history for that lot, may be scanned and uploaded to the MES database. Substrate lot history may include information such as who made the substrate lot, and when and where it was made. Historical information may include other information in further embodiments.

The strip map may be uploaded to a strip map server 402, explained below, which may be in communication with (or part of) the MES database. In embodiments, during or after generation of the initial version of the strip map, the strip map may be updated with the locations of the X out bad substrate units.

As noted, in addition to storing a strip ID for each substrate strip 200, the step 104 of creating the strip map may further include storing a unique ID for each instance of a substrate 204 on the strip 200. As the type of substrate used in a work order is known, the control program or other aspect of the MES system may generate unique IDs for each substrate 204 on a strip 200 using some pre-defined convention of identifying individual substrates based on their position on a substrate strip 200.

For example, with respect to the 80 substrates 204 shown on the strip 200 of FIG. 7, the MES control program may adopt a convention where the rows are assigned a letter A-D starting from the bottom and the columns are assigned a number 1-20 starting from the left. Thus, the substrate in row 2, column 4 may be identified as B-4. As an alternative, a convention may be defined which numbers each position consecutively, for example the first row from the bottom are number 1 through 20, the second row from the bottom are numbered 21-40, etc. It is understood that each substrate may be assigned a unique identifier by other conventions in further embodiments. Moreover, as indicated, different substrate strips may have different shapes and numbers of substrates in further examples. This information may be stored as part of the strip map.

In step 106, the substrate strip 200 may be processed prior to connection of the passive components, including for example solder application, cleaning and inspection. In step 108, any such process steps may be stored by the MES control program in the MES database in association with the substrate strip 200 and/or specific substrates 204. Additional information relating to the processes may also be stored in association with the strip 200 and/or specific substrate 204, including for example when and where the processes were performed, the specific tool that was used, a maintenance record for that tool and/or fab personnel associated with the process.

At the same time or at a different time, analogous identification, storing and processing of wafer pieces to be used in production of the semiconductor devices may also be performed. As explained in the Background section, a separate wafer lot may be used for each die in the die stack to be affixed to the semiconductor device. In step 110, each wafer piece in each wafer lot may be identified. In embodiments, a unique ID may be marked on each wafer piece, either by the wafer manufacturer or within the card fabrication plant, for example using a marking process as described above with respect to the substrate strips. In a further embodiment, instead of marking each wafer piece, a wafer piece may be uniquely identified by its vertical position relative to other wafer pieces within a wafer sublot (e.g., the ninth wafer piece from the top of the sublot).

In step 112, a record may be created in the MES database for each die on a wafer, including the wafer sublot, wafer lot history, wafer piece ID for each wafer piece in the sublot and a die ID for each die on a wafer piece. This occurs for each wafer sublot used in a device fabrication process, including the one or more memory die wafer sublots/mother lot and the controller die wafer lot. In embodiments, as indicated above, when a wafer lot first enters the card fabrication plant, an MES wafer lot ID for that lot, as well as a history for that lot, may be scanned and uploaded to the MES database. Wafer lot history may include information such as who made the wafer lot, and when and where it was made. Historical information may include other information in further embodiments. The MES wafer lot ID and history may be uploaded to the MES database at a time other than when received within the card fabrication plant, such as for example when a wafer sublot is selected for use.

The step 112 further includes storing a wafer piece ID and die ID. As described in step 110, the MES control program identifies each wafer piece, either with a unique ID or by its position within an identified wafer sublot. The MES control program may also store the wafer piece identifier at the time it is generated. As for the identification of specific die on a wafer piece, the MES control program may store these using a pre-defined convention of describing the positions of all die on a wafer piece in terms of (x, y) coordinates. Spherical coordinates (r, θ) may alternatively be used to define the positions of die on a wafer piece. Other methods of identifying specific die on a wafer piece are contemplated, including by position on the wafer piece or a unique ID assigned to each die on a wafer piece.

In step 114, a wafer piece may be processed, including for example backgrind, dicing, inspection and cleaning. In step 116, any such process steps may be stored by the MES control program in the MES database in association with the wafer piece and/or die on the wafer piece. Additional information relating to the processes may also be stored in association with the wafer piece and/or die on the wafer piece, including for example when and where the processes were performed, the specific tool or tools that were used, a maintenance record for the tool(s) and/or fab personnel associated with the processes.

The embodiments described above with respect to FIGS. 4 and 5 enable maximum resolution as to backward traceability of the discrete components used within a semiconductor device, as explained below. In further embodiments, where maximum resolution is not required, one or more of the discrete component identification and storage steps described above may be omitted. Moreover, at least some of the steps described above with respect to FIGS. 4 and 5 may be performed later in the fabrication process, such as for example when the discrete components are assembled together into a semiconductor device, as will now be described with respect to the flowchart of FIG. 6.

In step 120, the next substrate 204 to receive passives and die on a strip 200 is selected. If not already done, the substrate lot number, strip ID and position of this substrate 204 are stored in the MES database by the MES control program. In step 122, a unique identifier for each passive component to be mounted on the selected substrate 204 may be stored in the MES database in association with the selected substrate 204. The passives, including for example resistors and/or capacitors, may have their own unique identifier, which gets scanned or otherwise entered by fab personnel into the MES database in association with the substrate 204 on which they are to be mounted. The passive components may then be surface mounted on the selected substrate 204 and reflowed in step 124.

Figure 8:
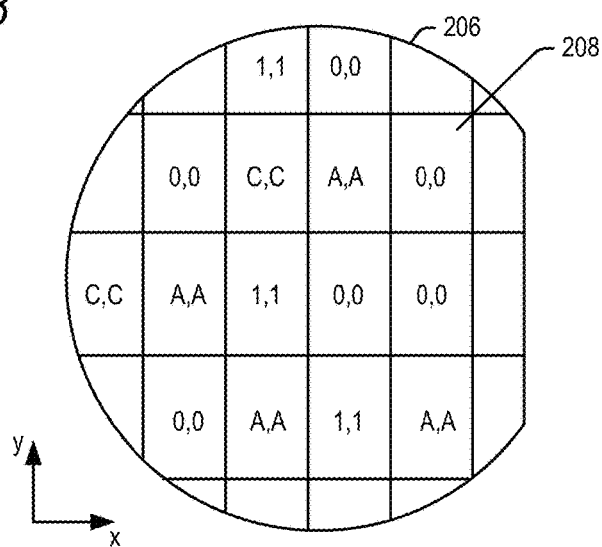
FIG. 8 is an illustration of a KGD map used in embodiments of the present technology.

In step 126, die are selected for mounting on the substrate 204 based on a KGD map. A representation of a KGD map is shown in FIG. 8 for a single wafer piece from an MES wafer sublot. As noted, semiconductor devices may include different numbers of semiconductor die, and there may be a separate wafer sublot used for each die to be mounted in a die stack on the substrate 204. Thus, where there are for example 2, 4 or 8 memory die to be mounted on the substrate 204, there may be 2, 4 or 8 MES wafer sublots, respectively, feeding die to the substrate. There may be a KGD map of each wafer piece in each MES wafer sublot, which KGD maps are provided by the wafer piece manufacturer based on testing done at the manufacturer.

FIG. 8 shows an example of a wafer piece 206 having a plurality of semiconductor die 208 (one of which is numbered in FIG. 8). The goodness of a die may be represented in the KGD map by alphanumeric codes associated with each die 208 on wafer piece 206. In this example, 0,0 may represent a die with no detected flaws; A,A may be a good die with minimal flaws; and 1,1 may represent a bad die which should not be selected for mounting on any of the substrates 204. It is understood that any of a variety of other schemes may be used by a KGD map to represent the goodness of a die on a particular wafer piece 204.

The die selected in step 126 from wafer pieces in different MES wafer lots may be selected based on a number of different criteria. In one embodiment, flawless die (0,0) from wafer pieces in the respective MES wafer sublots may be first selected and attached together on substrates 204. Substrates having only flawless die are likely to result in the highest quality semiconductor devices. As explained below, one aspect of the present technology allows identification and segregation of semiconductor devices having the highest quality semiconductor die. These devices may then be shipped to OEM manufacturers or others for a premium. Selection of only flawless die for mounting in a single semiconductor device may optimize the chance of that device being of the highest quality. If the flawless die from one or more wafer pieces in respective sublots have been exhausted, then the next best die (A,A) may be used. It is understood that the die selected for attachment within a given semiconductor device may be selected based on a variety of other criteria in further embodiments.

In step 128, the MES wafer sublot, wafer piece ID and selected die position on the wafer piece may be stored in association with the substrate 204 on which the selected die are to be mounted. This may be done for each die from the different sublots to be mounted on the substrate. In accordance with aspects of the present technology, in step 128, the stored strip map may be downloaded and updated to include the KGD wafer map, and a correlation between the KGD wafer map and strip map, as explained below. After all die to be mounted on a given substrate have been identified and stored in association with that substrate in the strip map in step 128, the die may be mounted on the substrate in step 130. The order of steps 128 and 130 may be reversed in alternative embodiments. The die may be mounted to the substrate for example via a die attach adhesive in a known adhesive or eutectic die bond process.

Once the die and/or passives have been mounted on a substrate, that assembly may be considered a semiconductor device (although further processing steps are performed before it is a finished package as explained below). At this point, it is possible to assign each semiconductor device a unique device ID. However, as explained hereinafter, assignment of a unique device ID may alternatively be performed later in the process, for example in relation to the laser mark step 142.

In step 136, semiconductor devices formed on substrates may go through a wire bond process for wire bonding die bond pads on each device semiconductor die 208 to contact pads formed on the substrate 204. As noted in the Background section, this process is relatively time consuming. As such, an MES assembly lot may be subdivided into MES assembly sublots. The information for each device may be updated in the MES database to reflect the particular assembly sublot and process tool to which each device is transferred.

Following the wire bond step 136, the devices in the respective assembly sublots may be encapsulated in a molding compound in step 138, assigned a unique device ID in step 140, laser marked with an identifier in step 142 (steps 140 and 142 are explained in greater detail below), singulated into separate semiconductor devices in step 144 and inspected in step 148. As discussed in the Background section, the respective sublots may stay separated for steps 138, 140, 142, 144 and/or 148. Alternatively, at one of these steps, one or some of the assembly sublots may recombine, or all assembly sublots may recombine into the original assembly lot.

The step 140 of assigning a unique device ID to each device, and the step 142 of laser marking that unique device ID on a device may both be performed by the laser marking station 319 associated with device marking. FIG. 9 shows a top view semiconductor device 210 after encapsulation, singulation and laser mark. The laser mark may include a logo 212 and an alphanumeric representation 214 of the unique ID associated with the device. The logo 212 may be omitted in embodiments. The device unique ID representation 214 may have the format of:

YWWDMLLXXX, where:
Y represents the year's last digit;
WW represents the week # within the year;
D represents the day within the week (1 to 7);
M represents the card fabrication plant;
LL represents an alphanumeric 2-digit ID to designate each MES assembly sublot; and XXX represents an alphanumeric 3-digit unique ID to distinguish each device made with the same date, location and MES assembly sublot information.

The first seven digits in the unique ID representation 214 are known by the MES system for each device. The last three digits may be generated and assigned for example by the molded strip laser marking station 319 as it marks each device. As one example, the molded strip laser marking station 319 may assign successive device identifiers as successive devices 210 are processed. The unique ten digit ID may then be stored by the MES control program in the MES database as a means of uniquely identifying the specific device 210 in the database. Instead of the last three digits being generated by the laser mark station, it is understood that the unique device identifier for each device 210 may be generated by another component within the MES system. The component may then communicate the unique device ID to the laser mark station, which marks each device 210 with the ten digit device identifier.

There may be greater or fewer than three digits at the end of the unique ID representation 214, depending on how many digits are required to uniquely identify each device for that date, location and MES assembly sublot. In a non-limiting example, any of the digits, such as for example the sublot number LL and the assigned digits XXX, may have 33 possible values as described above (10 numeric values and 23 letters of the alphabet (A-Z, minus the letters B, O and I)). Thus, for example the sublot number LL may uniquely identify any of 1089 sublots, and the assigned three digit code may uniquely identify any of almost 36,000 devices within a given sublot. It is understood that a given digit may represent more or less values in further embodiments. It is further understood that additional or alternative information may be included within the unique ID representation 214 in further embodiments, with the provision that the representation uniquely identify the semiconductor device 210 bearing the representation. For example, it will be appreciated that the date information may be represented in different ways in the representation 214. A wide variety of other formats are contemplated.

The marking further includes a code 218 having the same information as the alphanumeric representation 214, but in machine-readable form. The machine-readable code 218 may be a two-dimensional matrix code, but it is understood that the computer readable code may be a one-dimensional bar code or any other marking in which the unique device ID may be encoded in such a way so as to be understood by a computing device. In embodiments where a computer can read alphanumeric text, the separate matrix or other code in addition to the text may be omitted.

The logo 212, representation 214 and/or code 218 may be made by laser or other known printing operation. Instead of marking, adhesive labels including the above-described information may be affixed to each semiconductor device 210. The locations of the logo 212, representation 214 and code 218 shown in FIG. 10 are by way of example only, and the location of each may be moved to different locations. One or more of the logo 212, representation 214 and code 218 may be placed on a back surface of the semiconductor device 210 in further embodiments.

While the provision of both the alphanumeric representation 214 and code 218 on a surface of the device 210 is helpful, it is understood that one or the other of these may be omitted in further embodiments. As noted above, the code 218 may be omitted where a computing device is able to read and comprehend the alphanumeric representation. Alternatively, though more time consuming, the code 218 may be omitted and fab personnel can input the alphanumeric representation via a keyboard or other input device associated with the MES control program. Similarly, while it is useful to allow people to read the alphanumeric representation 214, it may be omitted, in which event, people may identify the unique ID once the code 218 is scanned.

After a three digit code XXX is assigned to a device by the molded strip laser marking station 319, the molded strip laser mark station may then upload the three digit code so that the MES system then has a unique ten digit identifier for each device. The unique ten digit identifier may then be stored in the MES database to allow unique identification of each specific device in the process.

Referring now to FIG. 10, the MES database may have a table 220 with all of the data it needs for backward traceability of all relevant information relating to all processed devices. This information may include for example the specific discrete components (as opposed to a wafer lot, substrate lot or passive component lot) that are included in each device. As shown in FIG. 10, the MES database may store the unique ID for a device, together with the following information associated with that unique device ID:

the MES assembly sublot to which the device belongs;
the substrate lot number, strip ID and position on the identified strip;
the MES wafer sublot number, wafer piece ID and die position on the wafer piece for the first die;
the MES wafer sublot number, wafer piece ID and die position on the wafer piece for the second die; . . .
the MES wafer sublot number, wafer piece ID and die position on the wafer piece for the die n (in an n-die stack).

In the embodiment of FIG. 10, specific information relating to the passive components is not shown in the table 220, but this information may be included in further embodiments.

With the association of a specific discrete component (die, substrate and/or passive) with a specific unique device ID, all of the above-described stored information regarding the discrete components may be associated with a specific semiconductor device by its unique device ID. As noted above, a wealth of information is generated and stored relating to discrete components prior to the time they are assembled into a semiconductor device. Once a unique device ID is generated for a semiconductor device, all of the stored information for the discrete components in that device may be associated in the MES database with that unique device ID. Thus, for example, using a device's unique ID, the following information may be quickly and easily accessed from the MES database:

For the semiconductor die (memory and controller) used in the device:
Manufacturer;
When and where manufactured;
When received at device fabrication plant;
When and where backgrind, dicing and other processing steps performed (while still part of a wafer piece or thereafter) and by whom;
Where on the wafer the die was located (as described above).
For the substrate used in the device:
Manufacturer;
When and where manufactured;
When received at device fabrication plant;
When and where surface mounting and other processing steps performed (while still part of a strip or thereafter) and by whom;

Where on the strip the substrate was located (as described above).

For passives used in the device:
Manufacturer;
When and where manufactured;
When received at device fabrication plant;
When and where surface mounted and other processing steps performed and by whom.

As noted above, using the uploaded information stored in association with a unique device ID, the specific substrate strip and substrate position used in a semiconductor device is stored and identifiable, and the specific semiconductor die that are mounted to the known substrate position are stored and identifiable. It is understood that this information may be gathered and stored in a number of different ways.

In accordance with aspects of the present technology, when the die mounted on the substrate strip, the strip map may be downloaded at the die bonding station, and the strip map may be updated to include information relating to which specific semiconductor die are mounted to which specific substrate on a substrate strip. For example, as shown in FIG. 14, a die bond mechanism such as a pick and place robot 400 (a portion of which is shown in FIG. 14) may be used to lift die 208 from the wafer 206a and mount them on a substrate 204 of a substrate strip 200. In the example of FIG. 14, the die bond robot 400 has removed a first die 208a from a location (shaded in FIG. 14) and mounted it on substrate 204a on strip 200. The die bond robot 400 is shown transferring a second die 208b from a location (shaded in FIG. 14) to a second substrate 204b on strip 200.

In an embodiment, the die bond robot 400 may include or communicate with a computing device 402 shown schematically in FIG. 14. The computing device 402 may be as shown and described above in FIG. 13, and may include a processor 302 and a memory 304 as described above. In embodiments, the computing device 402 may be a server, referred to herein as a strip map server. The computing device 402 may further communicate with a remote server 406 including an MES database as described above. Alternatively, the computing device 402 may itself be or include the MES database.

The die bond robot 400 may include servo controls such that the x, y, z position of the robotic vacuum tip 410 (on which the die 208 are supported during transport) is known in three-dimensional space. As noted above, the positions and quality of individual semiconductor die 208 on the wafer 206 are known and stored in a KGD map. The KGD map is accessible to the processor 302, either from the server 406 or from within memory 304. Using the KGD map and the known x, y position of the vacuum tip 410 relative to the die on the wafer 206, the die bond robot knows the position, identity and quality of a die 208 when acquired from wafer 206 by the vacuum top 410.

Additionally, the position of the vacuum tip 410 is also known relative to the positions of the substrates 204 on strip 200. Thus, when a die, such as die 208b is transferred by die bond robot 400 from the wafer 206 to a substrate, such as substrate 204b, the processor 302 updates the strip map in memory 304 with the identity of a die 208 in association with a substrate 204 on which it is mounted. As noted above, a unique identifier for each substrate on the strip 200 may have been created earlier. Alternatively, the processor 302 may create a unique identifier for a substrate 204 when a die 208 is mounted thereon.

Figure 15:
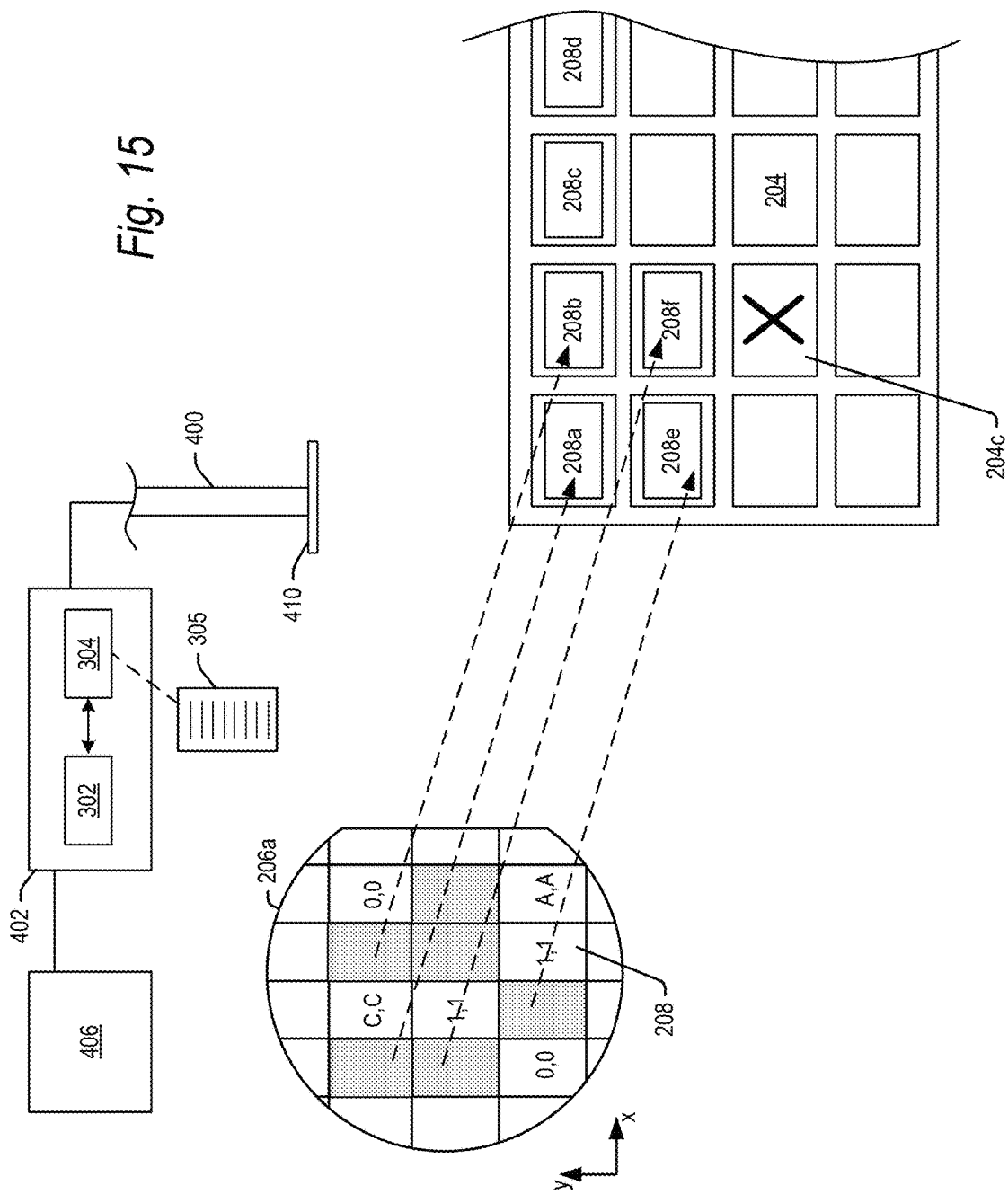

Thus, as shown in FIG. 15, the processor 302 may store in memory the strip map 305 including specifically identified die from wafer 206 as being mounted to specifically identified substrates 208, for all die mounted on the strip 200. The strip map 305 may for example be generated or updated in real time, as die are transferred from wafer 206 onto the strip 200 by the die bond robot 400.

Die 208 continue to be mounted on a substrate strip 200 by the robot 400, skipping substrate locations 204c that are known to be X out bad locations. As explained below, under the control of the computing device 402, the die bond robot 400 can select specific die 208, for example die of a certain known quality, for placement on a substrate strip 200. It may happen that, in mounting die from the wafer 206a onto strip 200, the die of the selected quality may run out. Thus, as shown in FIG. 16, a second wafer 206b may be accessed, its KGD map downloaded, and the mounting of die 208 of the selected quality may continue from wafer 206b onto the substrate strip 200. Depending on the type of die selected, the die mounted on a strip 200 may come from one, two or more than two wafers 106 in embodiments.

As noted, each semiconductor device formed on a substrate 204 may include a multiple semiconductor die. These die may include a stack of memory die, and may include a controller die mounted above or below the stack or on the substrate next to the stack. In operation, after a first group of semiconductor die 208 have been mounted to substrates 204, a second group of semiconductor die (from the same wafer 206, a different wafer 206 or a different lot) may then be mounted on the substrates 208 or on top of the first group of semiconductor die.

The processor 302 may update the strip map stored in memory 304 with the identities of all die in a die stack and the identities of the substrates 208 to which the die in a die stack were affixed. This process of adding additional die (third, fourth, etc.) may be continued, and the map updated, for each group of additional die mounted on the substrates 208. As one example, the die bond robot 400 may stack four semiconductor die 208, stepped in a first direction, on each good substrate location. Each stack may then be wire bonded. The die bond robot 400 may the stack a second group of four semiconductor die 208, stepped in the opposite direction, on each good substrate location. Each die in the second group may then be wire bonded. In this example, the strip map be updated as the die are mounted, after the first group of stacked die 208 are mounted, or after the first and second groups of stacked die are mounted.

After all die for the semiconductor device configuration being fabricated have been mounted on the substrates, the strip map stored in memory 304 has the identity of each semiconductor die 208 mounted on each substrate 204. The strip map with the substrate and die identifiers may then be uploaded from the strip map server 402 to the MES database within the server 406. In an alternative embodiment, the strip map may be uploaded in real time from the server 402 to the server 406 as die 208 are added to substrates 204.

The strip map stored in memory 304 may include some or all of the information shown in table 220, FIG. 10, explained below. This information may include some or all of the following items of data for a given substrate:
the substrate ID,
substrate position on the strip,
substrate strip ID,
substrate strip MES lot number and/or
substrate strip historical data such as the strip manufacturer, when and where the substrate strip was fabricated and/or when the strip arrived at the device fabrication plant.

For each semiconductor die mounted on that substrate, the strip map may include some or all of the following items of data:
   the die ID,
   the die position on the wafer from which the die came,
   the wafer ID,
   the MES wafer lot number and/or
   wafer historical data such as the wafer manufacturer, when and where the wafer was fabricated and/or when the wafer arrived at the device fabrication plant.

Die 208 may be selected from wafer 206 by die bond robot 400 for placement on the substrates 204 according to various schemes. For example, as explained hereinafter, it may be desirable to select die 208 from a wafer 206 of the same known quality for mounting on the substrates 204 of a given strip 200. In one embodiment shown in FIG. 17, semiconductor devices on a given substrate strip 200 may be formed entirely of flawless die (0,0 on the KGD map) and/or those which passed the memory test and card test without any reclaim. These devices may be used for sale to customers requiring higher performance. In further embodiments, the die selected from the wafer(s) may be of different known qualities. For example, FIG. 18 shows each substrate include two die of the same quality (0,0 and 1,1 in this embodiment). In addition to storing die identities in association with substrate identities as explained above, the strip map may also store the known quality of all die that are mounted on a particular substrate 204 and substrate strip 200.

In embodiments described in the preceding paragraphs, a variety of data may be stored in association with a specifically identified substrate, including for example the identities of the semiconductor die mounted thereon. As explained herein, a semiconductor device formed of an on a substrate may also be assigned a unique semiconductor device ID. This unique device ID may be assigned to a semiconductor device formed of and on a substrate before, during or after the strip map is generated by the die bond robot 400 as described above. Where a unique device ID is created and assigned before or during the operation of the die bond robot 400 to mount die 208 on the substrates 204, the device ID may also be stored in association with a particular substrate.

In addition to or instead of associating specific semiconductor die with specific substrates, the same may be provided for the mounting of the passives on the substrate. Thus, when a robot is used to mount a passive component on a substrate, such as a capacitor or resistor, a unique ID for the passive component may be stored in association with a unique ID for the substrate on which the passive component was mounted. This process may be performed before or after mounting and identifying semiconductor die for a given substrate as explained above.

All of the above-described data on the strip map may be cross-referenced to each other and accessible to an operator having access to the MES database and/or memory 304. A user interface may be provided enabling an operator to for example, enter a substrate ID, and obtain all of the above information for the semiconductor die and/or passives mounted on that substrate. The operator may enter a substrate strip, or MES strip lot number, and obtain the IDs of all substrates on that strip or strip lot number, as well as the die and passives mounted on the respective substrates. The operator may enter a semiconductor die ID or passive ID, and find the specific substrate on which the die or passive is mounted. A wide variety of other information may be available on the discrete components of a semiconductor device through the generation and storing of the strip map.

The above-described information may also be available to an operator before a device ID is assigned and/or before the device ID is inscribed on the mold compound as described below. In embodiments, individual substrates may be laser marked with their unique ID at any point after it is assigned. In embodiments the substrates which are known to be good may receive a laser mark. Those substrates known to be X out bad substrates, or substrate/die stacks otherwise known to be faulty, do not receive a laser mark. In further embodiments, the X out and/or bad substrate/die stacks may receive a laser mark.

The mark may be an alphanumeric code and/or a machine-readable code. At any point thereafter, and possibly in real time, an operator can visually inspect or scan the substrate ID on a given substrate and know what discrete components have been mounted on that substrate to that point in time. As explained hereinafter, at each process station or tool, the MES database may be updated for a given substrate or substrate strip as a whole as to the processes performed on the substrate or substrate strip. This is referred to a forward traceability and is explained below.

The above information regarding the discrete components may be stored along with the information shown in FIG. 10, or it may be cross-referenced in the MES database with the information shown in FIG. 10. With the above information, the MES database can provide complete backward traceability with respect to all of the discrete components within a given semiconductor device. This information may be accessed by knowing a device's unique ID, which is printed right on the device as explained above (both in human-readable and machine-readable formats). The information shown in FIG. 10 and described above is not intended as an exhaustive listing of the information which may be stored in the MES database regarding a semiconductor device and its discrete components. Additional and/or alternative information may also be stored in further embodiments in association with a unique device ID.

In addition to backward traceability, uniquely identifying each device 210 also enables forward traceability. Each process tool (or personnel associated with each such process tool) may have a scanner 320 in communication with the MES control program. The scanner at a given tool scans the matrix code 218 of a device 210, and the MES control program updates the MES database to indicate that the device 210 is undergoing the process or test at that tool. The scanner may scan one device 210 at a time, or the scanner could potentially scan the code 218 of a number of devices 210 at one time.

Upon scanning of a device at a given process tool (fabrication or test), the MES control program may record the process step (in the strip map and/or elsewhere), as well as information about the process step, in association with the device's unique ID number. This recorded information may include for example a date and time the device underwent a process, personnel associated with the tool performing the process, a maintenance record of the process tool, and a wide variety of other information. It may also happen that a semiconductor device gets damaged in a process, and this damage is identified, for example in a post-process AOI step. The strip map may be updated with this information and the location of the damaged semiconductor device location so that further processing of this location can be avoided and/or the device at that location marked for reclaim. The unique device ID, together with the scanning of that ID for all processes the device undergoes, provides complete forward traceability of the device 210 as it moves through the fabrication and testing processes.

Figure 11:
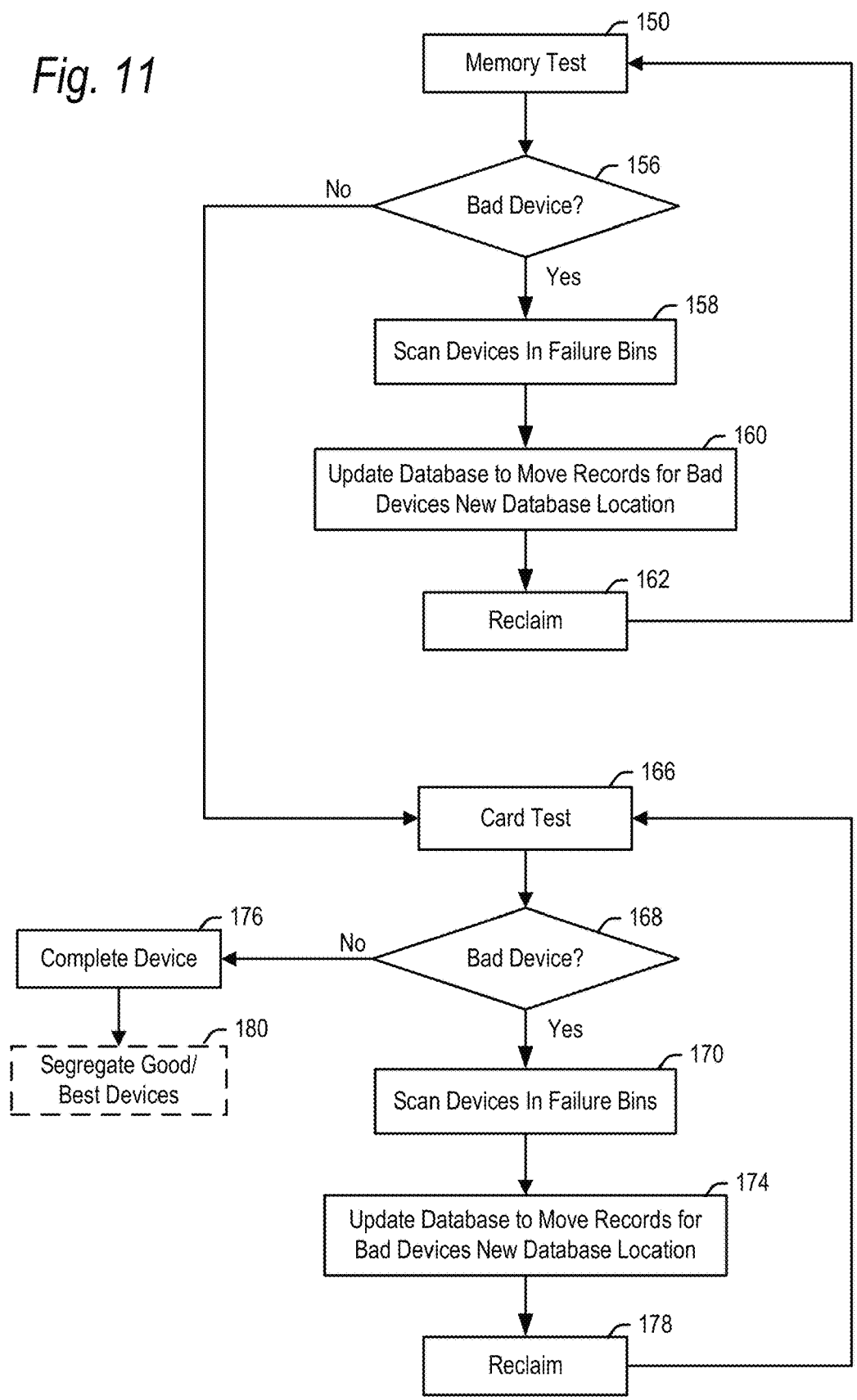
FIG. 11 is a flowchart of an embodiment of the present technology for testing a semiconductor device.

Referring now to FIG. 11, after singulation and marking of devices 210, the devices 210 may undergo memory testing and card testing. For memory testing, several assembly sublots can be combined to a larger test lot in an N to 1 consolidation for efficient testing and equipment utilization. As one example, 25 assembly sublots may be combined into a single test lot, though it can be more or less assembly sublots in further examples. In step 150, a consolidated test lot may undergo a memory test. The memory test may include multiple read/write operations to each device 210 in the test lot, possibly at hot and cold temperatures. The memory test in step 150 may include other or alternative tests, such as for example burn-in.

As explained in the Background section, the memory test 150 results in a binning of the semiconductor devices in the test lot, where the devices are physically separated into different bins. In one example, there may be 7 bins, where devices in bins 1-4 are deemed to have satisfactorily passed the test operation(s), and devices in bins 5-7 have not. The embodiment of 7 bins, with bins 1-4 passing and bins 5-7 requiring retest, is by way of example only. A variety of other binning and classifications may be used where devices which satisfactorily perform the memory test are distinguished from those that do not.

In step 156, if any device winds up in bins 5-7, the device ID is scanned in step 158, and the record for that device in the MES database is moved to a different logical partition (still within the MES database, but within a different set of stored records). Thus, the steps 156, 158 and 160 of identifying bad devices and moving the records for the bad devices to a new location, results in two different overall classifications of devices. Database records for devices which pass the memory test remain unchanged in the database. These devices, referred to herein as a prime test sublot, are transported to the card test as described below.

On the other hand, records for devices which wind up in bins 5, 6 and 7 are scanned to record their bin, and records for those devices moved to a new database locations. Other information may also be stored with the records in the new locations, including for example date and time, test personnel, etc. Records for individual devices may be identified by their unique ID number as explained above. With the separation into different database locations, it may be readily apparent which devices performed well in the memory testing steps and which devices did not.

In step 162, those devices ending up in bins 5-7 may go through reclaim, where they are retested in step 150. As indicated in the Background section, the type of retest may depend on which bin a device was classified into. After retest, the devices are again binned, and bad devices scanned. Database records for these devices that fail binning a second time may again be moved to a new database location. By this system, the MES database will have an express record of how a given device performed in testing step 150. Where a device fails multiple times, each instance and resulting binning will be stored in association with that device. The present system allows the MES control program to provide a variety of real-time data. In one aspect, the MES control program may indicate when a device has failed the testing step 150 a predetermined number of times, in which event that device may be removed from further testing.

In the system of steps 150 through 162, only those devices that failed testing are scanned. This provides advantages in that the devices which pass, which would typically be a very large number of devices, do not need to be scanned. However, in further embodiments, all devices may be scanned after test, and the information regarding their binning may also be added to the database. In embodiments, instead of removing bad device records, all records may be left within their original location in the database, but their record is updated to reflect the test result. Here again, only bad devices may be scanned and their record updated, or all devices may be scanned and their record updated.

For devices 210 which pass the testing step 150 (bins 1-4), the devices may be combined into a card test lot for a card test in step 166. The card testing steps may be similar to the memory testing steps, but additional or different tests are run, such as for example seeing how the devices 210 handle downloaded content. The devices 210 are subjected to a card test in step 166 and the devices are binned depending on how they perform in step 168. This binning may be by the same or different procedure than in the memory test step. Bad devices may be scanned in step 170, and their records moved to a new database location together with the binning information in step 174. These devices may be reclaimed in step 178, and the process repeated. Each time a device 210 goes through reclaim, its record, together with the reclaim information, may be moved to a new location upon failure.

Those devices 210 which pass the card test, may go through final labeling or handling in step 176 at which point the devices 210 are finished semiconductor packages ready for shipment. One aspect of the present technology allows identification of the best devices. That is, given the tracking of each device and storage of information about the device, the MES control program can identify devices which for example have only flawless semiconductor die (0,0 on the KGD map) and/or those which passed the memory test and card test without any reclaim. These devices may be segregated in step 180 for sale to customers requiring higher performance. The remaining good quality devices may be sold elsewhere. Similarly, devices which passed the memory and/or card tests after several reclaims may be segregated, for example to be sold at a lower price. Segregation step 180 may be omitted in further embodiments.

Figure 12:
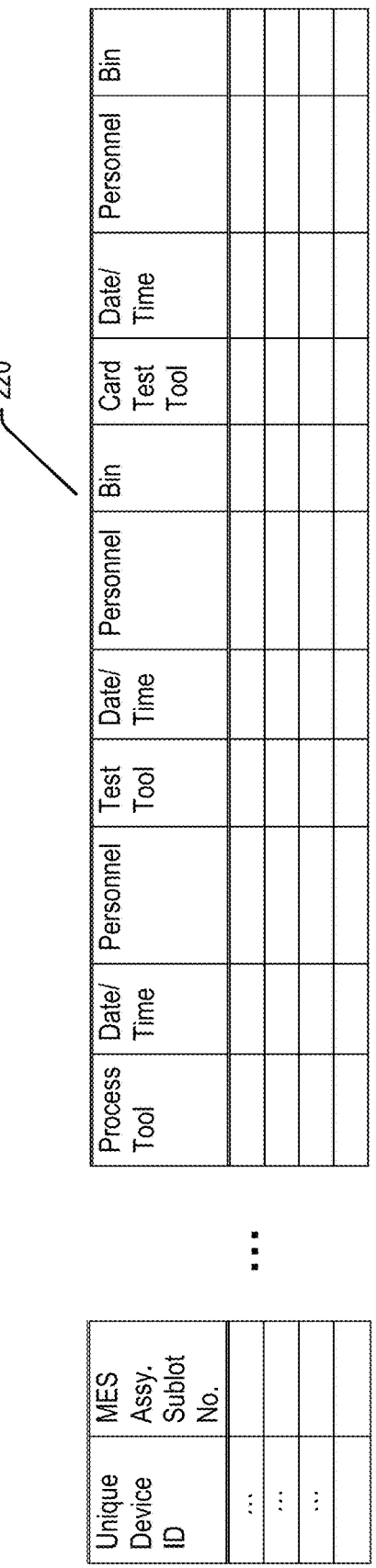
FIG. 12 is a table including information on a semiconductor device and its processes according to an embodiment of the present technology.

FIG. 12 shows the table 220 further including records for all process tools a semiconductor device went through, and all testing procedures the semiconductor device went through. (The table 220 may also include all of the discrete component information shown in the table 220 of FIG. 9, which is omitted from FIG. 12 for clarity). The table 220 may further have records for each reclaim process a semiconductor device went through during a test operation. As above, the table 220 of FIG. 12 is shown by way of example only, and may include additional or different information in further embodiments.

The present system provides complete backward and forward traceability of a semiconductor device and its discrete components as the semiconductor device travels through the fabrication process, and the present system provides this traceability in real-time. Such a system provides better resolution than was possible with conventional tracking and traceability systems. As discussed in the Background section, conventional traceability systems did not have a unique ID associated with each device, and did not have the ability to trace back and track the specific discrete components (die, substrate and/or passives) used in a device. As one consequence, when a problem with a device was detected after fabrication, conventional systems had limited ability to find the problem. Prior art systems allowed identification of MES assembly lots, from which it could be determined what processes a given device went through. From this, further research could reveal a wafer lot, and possibly reveal where a problem occurred. However, such research was time consuming and did not provide any specific identification or information on the discrete components from which the semiconductor device was formed.

These problems are solved in the present system. Where a problem with a device is detected, a query to the MES database can instantly reveal all processes the device went through, as well as an identification, process steps and information relating to the specific die, substrate and/or passives used. Not only does this enable identification of the source of a problem more easily, but it can quickly reveal problem trends. Analysis of a small number of problem devices may quickly and easily identify a common factor between them, whether at the device level or the discrete component level. For example, it may happen that a sampling of problem devices reveals that each problem device was made using semiconductor die from a particular wafer sublot or lots coming from a particular wafer manufacturer. The ability to pinpoint the source of a problem, even when occurring at the discrete component level, provides a marked advance over conventional MES platforms.

Moreover, as traceability is possible in real-time, the source of a problem may be identified and remedied as soon as the problem is found, without wasting additional resources. For example, if a problem in a sampling of semiconductor devices during memory or card testing identifies a particular wafer lot or lots as the problem, the fabrication run may be stopped, and the problematic lot or lots removed from the process before further die from these wafers are incorporated into devices.

While the present system has been described in relation to a non-volatile memory package such as a memory card, it is understood that the methodology described herein may be used for complete backward and forward traceability in other semiconductor package technologies.

The MES control program and MES database may be part of an MES server 300, one example of which is now described with reference to FIG. 13. Components of MES server 300 may include, but are not limited to, a processor 302, a system memory 304, traceability database 306a, MES database 306b, various system interfaces and a system bus 308 that couples various system components. As noted above, the traceability database 306a and MES database 306b may be combined into a single database or distributed across multiple databases. The system bus 308 may be any of several types of bus structures including a memory bus or memory controller, a peripheral bus, and a local bus using any of a variety of bus architectures.

The system memory 304 includes computer storage media in the form of volatile and/or nonvolatile memory such as ROM 310 and RAM 312. RAM 312 may contain an operating system 313 for MES server 300, and the program modules of the MES software platform 314. One of these program modules may be the MES control program mentioned above. The MES control program may be that portion of the MES platform which directs various components of MES server 300 to retrieve data relating to the semiconductor devices 210 and the discrete components of the semiconductor devices 210. The MES control program may further be responsible for generating identifiers as described above. The MES control program may have further responsibilities.

The traceability database 306a and the MES database 306b may each for example be a relational database including computer-readable media which together store all MES data including data relating to the semiconductor devices 210 and the discrete components of the semiconductor devices 210 discussed above. The databases 306a and/or 306b may store other types of data and information as well.

Although shown as being part of MES server 300, the traceability database 306a and/or the MES database 306b may be remote from server 300, and may even be remote from the card fabrication plant in which the MES server may be located. There may be redundant and backup versions of one or both of the traceability database 306a and the MES database 306b in embodiments. Although not shown, the MES server 300 may also include a variety of other computer-readable media, including removable/non-removable, volatile/nonvolatile computer storage media.

The MES server 300 may include a variety of interfaces for the input and output of data and information. Input interface 316 receives data from a plurality of scanners 320 and input devices such as a keyboard 322 and mouse 324. The scanners 320 may be provided at process and test tools for reading the machine readable codes discussed above, such as the matrix code 218 on the semiconductor device 210. The scanners 320 may also read the machine readable codes on the discrete components. The number of scanners shown in FIG. 13 is by way of example only.

A video interface 330 may be provided for interfacing with a monitor 332. Monitor 332 may for example be used to provide a graphical user interface for fab personnel, and to display data from the various process and testing tools, as well as other plant operations. A peripheral interface 336 may be provided for supporting peripheral devices, including for example a printer 338.

The MES server 300 may operate in a networked environment via a network interface 340 using logical connections to one or more remote computers 344, 346. The logical connection to computer 344 may be a local area connection (LAN) 348, and the logical connection to computer 346 may be via the Internet 350. Other types of networked connections are possible. Thus, in addition to interfacing with the databases 306a and/or 306b to obtain traceability information within the card fabrication plant, the present system allows connection to the MES server 300 to obtain this information from any remote location having a network connection to the MES server.

It is understood that the above description of MES server 300 is by way of example only, and may include a wide variety of other components in addition to or instead of those described above.

In summary, one embodiment of the present technology relates to a system for tracking semiconductor packages. The system includes a semiconductor device having a substrate and one or more semiconductor die mounted on the substrate. The system further includes an identifier associated with the semiconductor device, the identifier uniquely distinguishing the semiconductor device from all other semiconductor devices.

In another embodiment, the present technology relates to a system for tracking semiconductor packages. The system includes a semiconductor device having a substrate and one or more semiconductor die mounted on the substrate. The system further includes an identifier associated with the semiconductor device, the identifier associating the specific semiconductor die used in the semiconductor device with the semiconductor device.

In a further embodiment, the present technology relates to a system for tracking semiconductor packages. The system includes a semiconductor device having a substrate and one or more semiconductor die mounted on the substrate. The system further includes an identifier associated with the semiconductor device, the identifier also associating with the semiconductor device: i) fabrication processes performed on the semiconductor device, ii) testing operations performed on the semiconductor device, and iii) how the semiconductor device performed in the testing operations.

In another embodiment, the present technology relates to a system for tracking semiconductor packages. The system includes a semiconductor device having a substrate, one or more semiconductor die mounted on the substrate, and passive components. The system further includes a computer-readable medium including stored information identifying at least one of: i) the substrate used in the semiconductor device, ii) the one or more semiconductor die used in the semiconductor device, iii) the passive components used in the semiconductor device, iv) tools at which the semiconductor was processed, v) tools at which the semiconductor device was tested, vi) binning of the semiconductor device after testing of the semiconductor device, and vii) whether and how many times the semiconductor device underwent a reclaim operation after a testing operation.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of fabricating a semiconductor device, comprising:
   (a) processing a substrate at a semiconductor processing station;
   (b) assigning the substrate an identifier;
   (c) picking a semiconductor die from a diced wafer with a pick and place robot, and placing the semiconductor die on the substrate, the pick and place robot associated with a processor;
   (d) storing by the processor data identifying a position from which the semiconductor die was picked from the diced wafer and the substrate on which the semiconductor die was placed, based on signals received from the pick and place robot, the data further including at least one of:
   i) an identity of a semiconductor die mounted on the substrate, and
   ii) an identity of a passive component mounted on the substrate,
   the data stored in association with the identifier enabling identification of at least one of the semiconductor die and passive component in a completed semiconductor device, and enabling identification of the semiconductor processing station; and
   (e) printing the identifier on an external surface of the completed semiconductor device.

2. The method of claim 1, wherein said step of storing data occurs in real time as at least one of the semiconductor die or passive component are mounted on the substrate.

3. The method of claim 1, wherein said step of storing data occurs after at least one of the semiconductor die or passive component are mounted on the substrate and all other substrates on a strip of the substrates.

4. The method of claim 1, further comprising the step of marking a surface of the substrate with the identifier.

5. The method of claim 4, further comprising the step of scanning the identifier during fabrication of the semiconductor device to identify in real time the identity of at least one of the semiconductor die and passive components mounted on the substrate.

6. The method of claim 1, further comprising the steps of:
   marking a surface of the substrate with the identifier;
   scanning the identifier on the surface of the substrate as the semiconductor device undergoes a process or test at a process or test tool, and
   storing data associated with the identifier including at least one of:
   iii) tools at which the semiconductor device was processed, and
   iv) tools at which the semiconductor device was tested.

7. The method of claim 5, wherein said step of storing the data occurs in real time as the semiconductor device is scanned.

8. The method of claim 1, wherein a plurality of die are mounted on the substrate, the identifier identifying each of the plurality of die, the plurality of die selected from a wafer based on a known quality of the plurality of die.

9. A method of fabricating a semiconductor device, comprising:
   (a) processing a substrate at a semiconductor processing station;
   (b) assigning the substrate an identifier;
   (c) picking a first semiconductor die of known quality from a diced wafer with a pick and place robot, and placing the first semiconductor die on the substrate, the pick and place robot associated with a processor;
   (d) picking a second semiconductor die having a known quality matching the first semiconductor die from a diced wafer with the pick and place robot, and placing the second semiconductor die on the substrate with the first semiconductor die;
   (e) storing by the processor data identifying the known quality of the first and second semiconductor die, and positions from which the first and second semiconductor die were picked from the one or more diced wafers and the substrate on which the semiconductor die was placed, based on signals received from the pick and place robot; and
   (f) printing the identifier on an external surface of the completed semiconductor device.

10. The method of claim 9, wherein said step of storing data occurs in real time as at least one of the first and second semiconductor die are mounted on the substrate.

11. The method of claim 9, wherein said step of storing data occurs after at least one of the first and second semiconductor die are mounted on the substrate and all other substrates on a strip of the substrates.

12. The method of claim 9, further comprising the step of marking a surface of the substrate with the identifier.

13. The method of claim 12, further comprising the step of scanning the identifier during fabrication of the semiconductor device to identify in real time the identity of the first and second semiconductor die mounted on the substrate.

* * * * *